United States Patent
Xiao

(10) Patent No.: US 9,502,583 B2
(45) Date of Patent: Nov. 22, 2016

(54) COMPLEMENTARY HIGH MOBILITY NANOWIRE NEURON DEVICE

(71) Applicant: SEMICONDUCTOR MANUFACTURING INTERNATIONAL (SHANGHAI) CORPORATION, Shanghai (CN)

(72) Inventor: Deyuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/980,623

(22) Filed: Dec. 28, 2015

(65) Prior Publication Data

US 2016/0190336 A1 Jun. 30, 2016

(30) Foreign Application Priority Data

Dec. 29, 2014 (CN) .......................... 2014 1 0840374

(51) Int. Cl.
*H01L 21/00* (2006.01)
*H01L 27/00* (2006.01)
(Continued)

(52) U.S. Cl.
CPC ... *H01L 29/7885* (2013.01); *H01L 21/823807* (2013.01); *H01L 21/823814* (2013.01); *H01L 21/823828* (2013.01); *H01L 21/823871* (2013.01); *H01L 21/84* (2013.01); *H01L 27/092* (2013.01); *H01L 27/1203* (2013.01);
(Continued)

(58) Field of Classification Search
CPC .............. H01L 21/823807; H01L 21/823814; H01L 21/823828; H01L 21/823871; H01L 21/84; H01L 27/1203; H01L 27/092; H01L 27/1214; H01L 29/7885; H01L 29/78696; H01L 29/0653; H01L 29/0673; H01L 29/78684; H01L 29/78681; H01L 29/78621; B82Y 10/00; B82Y 40/00
See application file for complete search history.

(56) References Cited

U.S. PATENT DOCUMENTS 6,882,051 B2 * 4/2005 Majumdar ............. B82Y 10/00
257/734
8,129,247 B2 * 3/2012 Bangsaruntip ......... B82Y 10/00
257/103

(Continued)

OTHER PUBLICATIONS

Shibata, Tadashi , "A Functional MOS Transistor Featuring Gate-Level Weighted Sum and Threshold Operations", IEEE Transactions on Electron Devices, vol. 39, No. 6, Jun. 1992, 1444-1454.

*Primary Examiner* — Nikolay Yushin
(74) *Attorney, Agent, or Firm* — Kilpatrick Townsend and Stockton LLP

(57) ABSTRACT

A method for forming a semiconductor device includes providing a substrate structure, which includes a nanowire structure supported by two isolation regions on a substrate. The nanowire structure includes a first nanowire and a second nanowire having different high mobility semiconductor materials and conductivity types. A multi-layer film structure is formed surrounding the nanowire structure and includes a conductive material layer sandwiched between two dielectric layers. A plurality of first electrodes are formed surrounding the multi-layer film structure surrounding a channel region of the first nanowire, and a plurality of second electrodes are formed surrounding the multi-layer film structure surrounding a channel region of the second nanowire. A third electrode is formed to contact one end of the nanowire structure, and a fourth electrode is formed to contact the other end of the nanowire structure. A fifth electrode is formed and coupled to a center portion of the nanowire structure.

20 Claims, 18 Drawing Sheets

(51) Int. Cl.
*H01L 29/00* (2006.01)
*B82Y 10/00* (2011.01)
*H01L 29/788* (2006.01)
*H01L 21/8238* (2006.01)
*H01L 21/84* (2006.01)
*H01L 27/092* (2006.01)
*H01L 27/12* (2006.01)
*H01L 29/06* (2006.01)
*H01L 29/786* (2006.01)

(52) U.S. Cl.
CPC ....... *H01L29/0653* (2013.01); *H01L 29/0673* (2013.01); *H01L 29/78621* (2013.01); *H01L 29/78681* (2013.01); *H01L 29/78684* (2013.01); *H01L 29/78696* (2013.01); *B82Y 10/00* (2013.01)

(56) References Cited

U.S. PATENT DOCUMENTS

| | | | | |
|---|---|---|---|---|
| 8,354,721 | B2* | 1/2013 | Xiao et al. | H01L 21/845 257/351 |
| 8,384,065 | B2* | 2/2013 | Bangsaruntip | B82Y 10/00 257/24 |
| 8,541,774 | B2* | 9/2013 | Bangsaruntip | H01L 27/1211 257/24 |
| 8,884,363 | B2* | 11/2014 | Xiao | B82Y 10/00 257/331 |
| 8,912,545 | B2* | 12/2014 | Xiao | B82Y 10/00 257/64 |

\* cited by examiner

COMPLEMENTARY HIGH MOBILITY NANOWIRE NEURON DEVICE

CROSS-REFERENCES TO RELATED APPLICATIONS

This application claims priority to Chinese patent application No. 201410840374.X, filed on Dec. 29, 2014, the content of which is incorporated herein by reference in its entirety. This application is also related to concurrently filed U.S. patent application Ser. No. 14/981,807, which claims priority to Chinese patent application No. 201410856188.X, filed on Dec. 29, 2014, and U.S. patent application Ser. No. 14/980,531, which claims priority to Chinese patent application No. 201410856215.3, filed on Dec. 29, 2014. All of the above applications are commonly owned and incorporated herein by reference in their entirety.

BACKGROUND OF THE INVENTION

The present invention relates to the field of semiconductor technology. Specifically, embodiments of the invention are directed to nanowire semiconductor device structures and manufacturing methods.

With the development of integrated circuits and the improvements in the degree of integration, there have been many difficulties and unsolved problems with conventional silicon integrated circuits based on single transistor functionality. For example, the ability to further increase the density of components on a chip is limited. Neuron MOS transistors (Neuron Metal-Oxide Semiconductor Field Effect Transistor, abbreviated as neuMOS or vMOS) as powerful single-cell transistors provide an effective way of addressing the increasing number of transistors in integrated circuits and interconnection lines.

A neuron MOS transistor has a floating gate, which is capacitively coupled to the input terminal. The functionalities of a neuron device are similar to those of the nerve cells forming the human brain, the eye, and the like. Specifically, a neuron device provides a weighted sum of a plurality of input signals and outputs a predetermined signal when the resultant weighted sum of input signals reaches a predetermined threshold value. Such a neuron device includes a weighting tool for providing a weighted sum of a plurality of input signals. When the weighted sum of input voltages reaches a predetermined value, the source and the drain of the neuron device become conducting with respect to each other. The weighting tool is equivalent to a synapse between neuron cells. For example, the weighting tool may include resistors and field effect transistors. A neuron transistor is equivalent to the cell body of a neuron cell.

BRIEF SUMMARY OF THE INVENTION

Embodiments of the present invention provide a complementary high-mobility nanowire neural device structure and manufacturing process.

According to other embodiments of the invention, a method for forming a semiconductor device includes providing a substrate structure. The substrate structure includes a substrate, a plurality of isolation regions in the substrate, a cavity between adjacent isolation regions, and a nanowire structure in the cavity. The nanowire structure includes a first nanowire and a second nanowire. The first and second nanowires, respectively, include a first end region, a channel region, and a second end region. The first end region of the first nanowire is connected to the first end region of the second nanowire. The first nanowire has a first conductivity type, and the second nanowire has a second conductivity type different from the first conductivity type. The method also includes forming a multi-layer film structure surrounding the nanowire structure. The multi-layer film structure includes a first dielectric layer, a conductive material layer, and a second dielectric layer. The method also includes forming a plurality of first electrodes surrounding the multi-layer film structure at the channel region of the first nanowire. The plurality of first electrodes are separated from each other. The method further includes forming a plurality of second electrodes surrounding the multi-layer film structure at the channel region of the second nanowire. The plurality of second electrodes are separated from each other. The method includes introducing dopants of the first conductivity type into the first and second end regions of the second nanowire, and introducing dopants of the second conductivity type into the first and second end regions of the second nanowire. The method also includes forming a third electrode surrounding the second region of the first nanowire, and forming a fourth electrode surrounding the second region of the second nanowire.

The method further includes removing a nanowire of the multi-layer film structure to expose the first end region of the first nanowire and the first end region of the second nanowire, and forming a fifth electrode coupled to the exposed first end region of the first nanowire and the exposed first end region of the second nanowire. The fifth electrode is insulated from the conductive material layer in the multi-layer film structure. The nanowire structure is supported on the substrate by the plurality of first electrodes, the plurality of second electrodes, the third electrode, the fourth electrode, and the fifth electrode support.

In an embodiment of the above method, forming the third and the fourth electrodes includes removing by selective etching the multi-layer film structures at the second end regions of the first nanowire and the second nanowire, and the two support structures. An evaporation and lift-off process is used to form the third electrode surrounding the second region of the first nanowire. The second end region of the first nanowire is heavily doped with impurities of the first conductivity type. The method also includes using an evaporation and lift-off process to form the fourth electrode surrounding the second region of the second nanowire, and heavily dope the second end region of the second nanowire with impurities of the second conductivity type.

In an embodiment, the third electrode and the fourth electrode can be formed using different materials.

In an embodiment, forming the fifth electrode includes the following steps.

using an etch back process to partially remove the multi-layer film structure at the intersection of the first end regions of the first and second nanowires to expose the first end region of the first nanowire and the first end region of the second nanowire;

oxidizing a surface region of the conductive material layer to form an oxide layer; and using an evaporation and lift-off process to form the firth electrode, the fifth electrode being insulated from the multi-layer film structure by the oxide layer.

In an embodiment, forming a multi-layer film structure surrounding the nanowire structure includes forming a multi-layer film structure overlying the insulating layer overlying the substrate and the two support structures.

In an embodiment, the first nanowire is a Ge nanowire, and the second nanowire is a nanowire of a III-V group material. In some embodiments, the III-V group material can include one or more of indium gallium arsenide (InGaAs), indium aluminum arsenide (InAlAs), indium arsenide (InAs), and indium antimonide (InSb).

In an embodiment, providing the substrate structure includes forming a Ge nanowire, which includes the following steps.

providing a substrate including a plurality of trench isolation regions disposed therein;
   forming a first cavity between adjacent trench isolation regions;
   forming a SiGe nanowire in the first cavity by filling the first cavity with a SiGe material using an epitaxial process;
   removing a portion of the substrate surrounding the SiGe nanowire to expose a surface of the SiGe nanowire;
   using an oxidation process to form a layer of oxide on the exposed surface of the SiGe nanowire;
   removing the layer of oxide on the exposed surface of the SiGe nanowire; and
   repeating the above oxidizing and removing processes to reduce the content of Si to form a Ge nanowire.

In an embodiment, providing the substrate structure includes forming a nanowire of a III-V group material, which includes the following steps.

forming a second cavity between adjacent trench isolation regions;
   forming a SiGe buffer layer over a surface of the second cavity;
   forming a III_V group material over the SiGe buffer layer to fill the second cavity using an epitaxial process;
   removing a portion of the substrate surrounding the SiGe buffer and the III_V group material to expose a surface of the SiGe buffer layer; and
   removing the SiGe buffer layer to form the nanowire of the III-V group material.

In an embodiment, the method also includes annealing the Ge nanowire and the nanowire of the III-V group material in an inert or reducing environment.

In an embodiment, the method also includes introducing dopants of the first conductivity type into the first and second end regions of the second nanowire and regions between the plurality of the second electrodes, and introducing dopants of the second conductivity type into the first and second end regions of the first nanowire and regions between the plurality of the first electrodes.

In an embodiment, the method includes introducing dopants into the nanowire structure to form lightly doped drain (LDD) regions and heavily doped drain regions.

In an embodiment, the first dielectric layer and the second dielectric layer in the multi-layer film structure includes a high K dielectric.

In an embodiment, the conductive material layer in the multi-layer film structure includes a polysilicon material or a metal material.

In an embodiment, the conductive material layer thickness is in the range of 2-10 nm; the first dielectric layer thickness is in the range of 1-3 nm; the thickness range of the second dielectric layer is in the range of 1-3 nm; the length of the first nanowire is 30-500 nm; the length of the second nanowire is 30-500 nm; adjacent first electrodes are spaced from each other by a distance of 10-50 nm; and an adjacent plurality of second electrodes are spaced from each other a distance of 10-50 nm.

According to some embodiments of the present invention, a semiconductor device includes a substrate and an insulating layer overlying the substrate. A nanowire structure having a first nanowire and a second nanowire is located above the insulating layer. The nanowire structure includes a first nanowire and a second nanowire. The first and second nanowires, respectively, include a first end region, a channel region, and a second end region. The first end region of the first nanowire is connected to the first end region of said second nanowire. The first nanowire and the second nanowire have different conductivity types. A multi-layer film structure surrounds the channel region and the first end region of the first nanowire and the channel region and the first end region of the second nanowire. The multi-layer film structure includes a first dielectric layer, a conductive material layer, and a second dielectric layer. The multi-layer film structure is partially removed to expose the first end region of the first nanowire and the first end region of the second nanowire. A plurality of first electrodes are disposed surrounding the multi-layer film structure at the channel region of the first nanowire. The plurality of first electrodes are separated from each other. A plurality of second electrodes are disposed surrounding the multi-layer film structure at the channel region of the second nanowire. The plurality of second electrodes are separated from each other. The device also has a third electrode surrounding the second region of the first nanowire, and a fourth electrode surrounding the second region of the second nanowire. The device further has a fifth electrode coupled to the exposed first end region of the first nanowire and the exposed first end region of the second nanowire. The fifth electrode is insulated from the conductive material layer in the multi-layer film structure. The nanowire structure is supported on the substrate by the plurality of first electrodes, the plurality of second electrodes, the third electrode, the fourth electrode, and the fifth electrode.

In an embodiment of the device, the second end region of the first nanowire is more heavily doped than the first end region and the channel region of the first nanowire. Further, the second end region of the second nanowire is more heavily doped than the first end region and the channel region of the second nanowire.

In an embodiment, the first nanowire is a germanium (Ge) nanowire, and the second nanowire is a III-V group material. In an embodiment, the III-V group material comprises one or more of InGaAs, InAlAs, InAs, and InSb.

In an embodiment, a portion of the multi-layer film structure is disposed between the electrodes and the insulating layer overlying the substrate.

In an embodiment, the first dielectric layer and the second dielectric layer in the multi-layer film structure include a high K dielectric. The conductive material layer in the multi-layer film structure includes a polysilicon material or a metal material.

In an embodiment, the conductive material layer thickness is in the range of 2-10 nm; the first dielectric layer thickness is in the range of 1-3 nm; the thickness range of the second dielectric layer is in the range of 1-3 nm; the length of the first nanowire is 5030-1000 500 nm; the length of the second nanowire is 30-500 nm; the adjacent first electrodes are spaced from each other by a distance of 10-50 nm; and the adjacent plurality of second electrodes are spaced from each other a distance of 10-50 nm.

A further understanding of the nature and advantages of the present invention may be realized by reference to the remaining nanowires of the specification and the drawings.

DETAILED DESCRIPTION OF THE INVENTION

Figure 1:
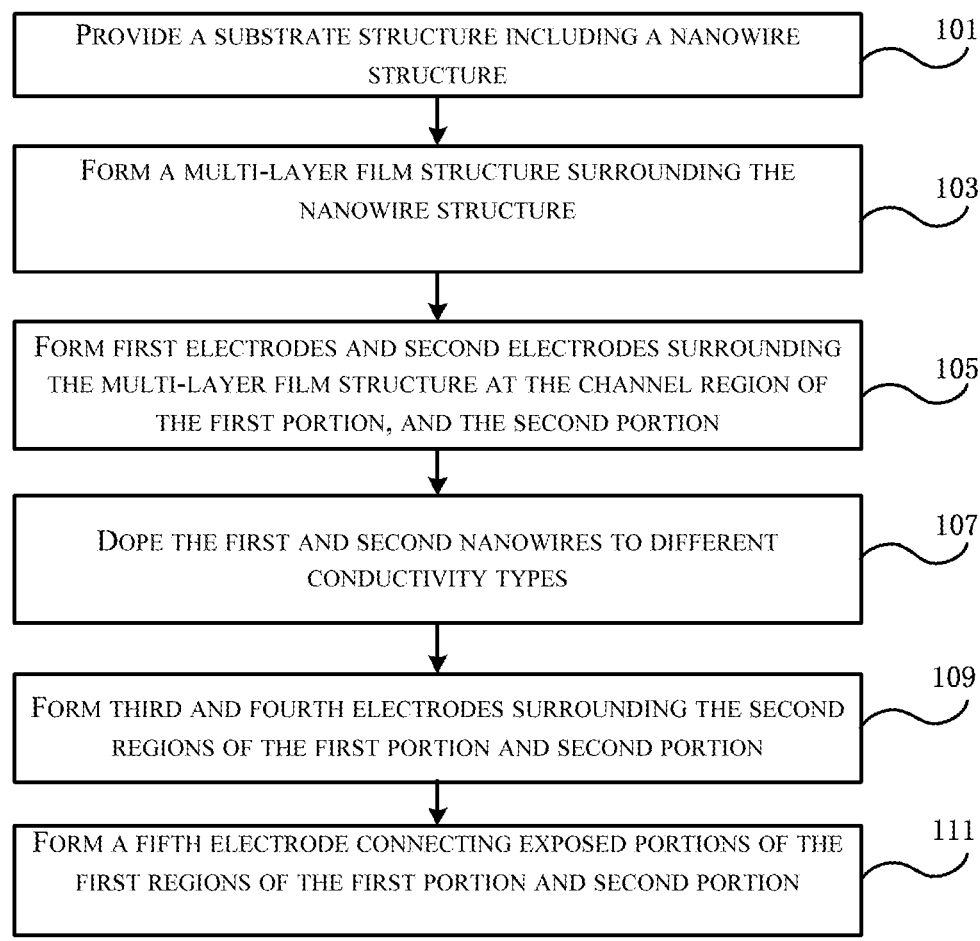
FIG. 1 is a simplified flowchart illustrating a method for forming a semiconductor device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

Embodiments of the present invention provide a semiconductor device and a manufacturing method, in which the semiconductor device can be used as a complementary-type nanowire structure neural component, which includes an n-type nanowire structure neural component (hereinafter referred to as n-type vMOS) and a p-type nanowire structure neural component (hereinafter referred to as p-type vMOS). The n-type vMOS and p-type vMOS each has a plurality of input electrodes, and both share a floating gate and an output electrode.

FIG. 1 is a simplified flowchart illustrating a method for forming a semiconductor device according to an embodiment of the present invention. As shown in FIG. 1, the method for forming a semiconductor device includes the following steps.

At step 101, the method for forming a semiconductor device includes providing a substrate structure. The substrate structure includes a substrate, a plurality of isolation regions in the substrate, a cavity between adjacent isolation regions, and a nanowire structure having a first nanowire and a second nanowire suspended in the cavity by adjacent isolation regions. In some embodiments, the isolation regions can be formed using a shallow trench isolation (STI) process. The nanowire structure includes a first nanowire and a second nanowire. The first and second nanowires, respectively, include a first end region, a channel region, and a second end region. The first end region of the first nanowire is connected to the first end region of the second nanowire. The first nanowire has a first conductivity type, and the second nanowire has a second conductivity type. In some embodiments, the first conductivity type is different from the second conductivity type. For example, the first conductivity type can be n-type, and the second conductivity type can be p-type. In some embodiments, the substrate can be a silicon substrate, but can also be other types of substrate. The insulating layer can be a silicon oxide.

The substrate may include, but is not limited to, a silicon substrate, and an insulating layer on a substrate is typically a silicon oxide. The isolation regions can be formed using a shallow trench isolation (STI) process using, for example, silicon oxide. First and second nanowires are nanowire made of semiconductor materials, and the first and second nanowires nanowire materials may be the same or different. When the first nanowire and the second nanowire materials are not the same, one of the nanowires can have a material having high electron mobility, and the other nanowire can have a material having high hole mobility. In one embodiment, the nanowire with high hole mobility may be a germanium (Ge) nanowire, and the nanowire with a high electron mobility may be a III-V group material. Further, the above-described group III-V material may include one or more of indium gallium arsenide (InGaAs), indium aluminum arsenide (InAlAs), indium arsenide (InAs), indium antimonide (InSb), and the like. It should be understood that first and second nanowire materials are not limited to the above-exemplified.

At step 103, the method also includes forming a multi-layer film structure surrounding the nanowire structure. The multi-layer film structure includes a first dielectric layer, a conductive material layer, and a second dielectric layer. The conductive structure can be used as a floating gate in the finished device.

At step 105, the method also includes forming a plurality of first electrodes surrounding the multi-layer film structure at the channel region of the first nanowire. The plurality of first electrodes are separated from each other. The method further includes forming a plurality of second electrodes surrounding the multi-layer film structure at the channel region of the second nanowire. The plurality of second electrodes are separated from each other. The first and second electrodes can be used as input electrodes in the device.

At step 107, the method also includes introducing dopants of the first conductivity type into the first and second end regions of the second nanowire and regions between the plurality of second electrodes, and introducing dopants of the second conductivity type into the first and second end regions of the first nanowire and regions between the plurality of first electrodes.

At step 109, the method also includes forming a third electrode surrounding the second region of the first nanowire, and forming a fourth electrode surrounding the second region of the second nanowire. The third and fourth electrodes can be the source/drain of the n-type vMOS and p-type vMOS.

At step 111, the method further includes removing a nanowire of the multi-layer film structure to expose the first end region of the first nanowire and the first end region of the second nanowire, and forming a fifth electrode coupled to the exposed first end region of the first nanowire and the exposed first end region of the second nanowire. The fifth electrode is insulated from the conductive material layer in the multi-layer film structure. The fifth electrode can be a common output electrode for the n-type vMOS and p-type vMOS. The nanowire structure is supported on the substrate by the plurality of first electrodes, the plurality of second electrodes, the third electrode, the fourth electrode, and the fifth electrode support.

In embodiments of the invention, the method for forming a semiconductor device includes the formation of a fully-surrounded channel region, which can be used as a complementary nanowire neural components. It can enhance the floating gate's ability to control the channel and avoid short channel effect. Further, the manufacturing process is more optimized and the device structure is simpler. Moreover, higher carrier mobilities can improve device performance.

FIGS. 2-24B are view diagrams that illustrate the method of forming a semiconductor device according to an embodiment of the invention. First, FIGS. 2-18 are referenced to illustrate a process for forming the device with a Ge first nanowire and an InGaAs second nanowire.

Figure 2:
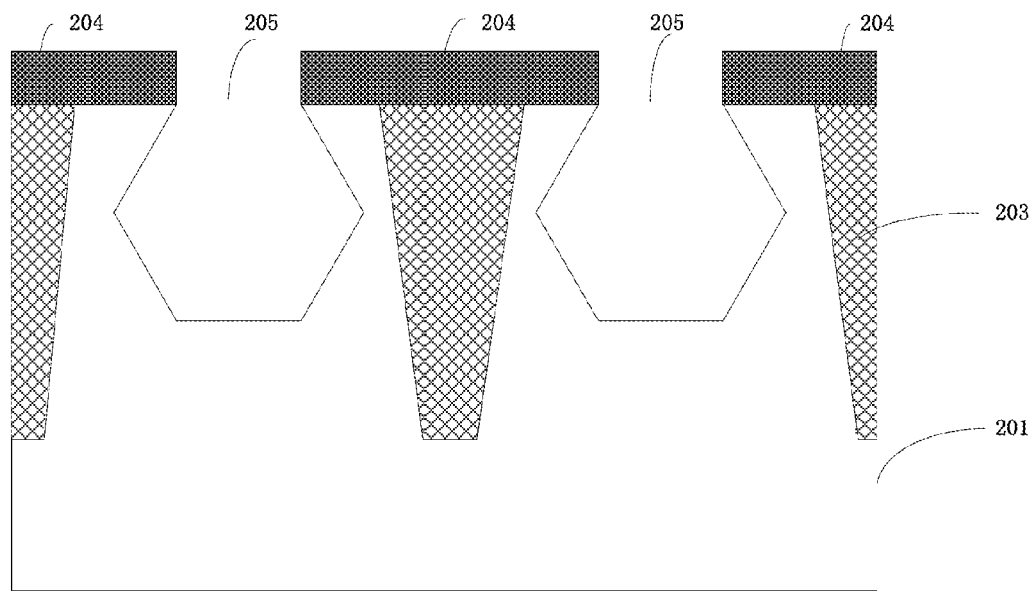
FIG. 2 is a cross-sectional view illustrating a stage of a method for manufacturing a Ge nanowire device according to an embodiment of the present invention.

FIGS. 2-7 are cross-sectional view diagrams that illustrate a method for forming a Ge nanowire in the substrate structure. As shown in FIG. 2, a substrate 201 is provided. The substrate can be a silicon substrate, but is not so limited. Isolation regions 203 are formed in the substrate. For example, a shallow trench isolation (STI) process can be used to form STI regions 203 in substrate 201. The substrate is etched using a patterned hard mask 204 as an etch mask to form first cavities 205. As shown in the cross-sectional view diagram in FIG. 2, First cavities 205 can have a sigma (Σ) shape. Alternatively, the cavities can have a bowl shape, rectangular, conical, or triangular shape. The cavities can have other shapes, such as polygonal, e.g., octagonal, etc.

Figure 3:
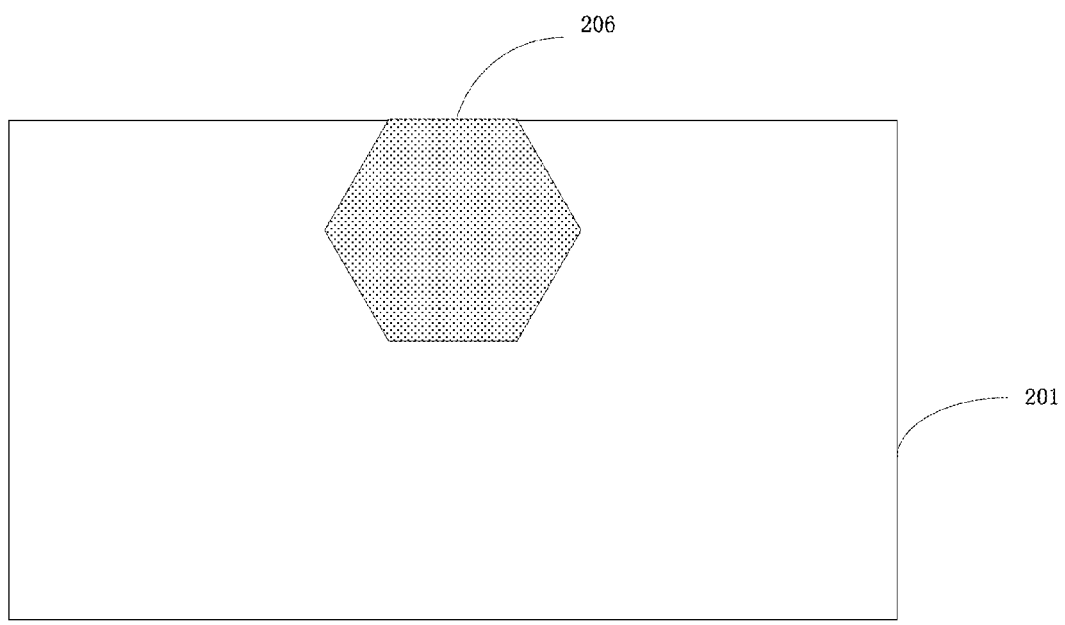
FIG. 3 is a cross-sectional view illustrating a stage of a method for manufacturing a Ge nanowire device according to an embodiment of the present invention.

In FIGS. 3-7, a single cavity is used by the remaining process of forming the Ge nanowire. As shown in FIG. 3, a silicon germanium (SiGe) material is used to fill the cavity in substrate 20 to form a Ge nanowire 206. In some embodiments, Ge nanowire 206 can be formed by epitaxial growth, chemical vapor deposition (CVD), metal organic chemical vapor deposition (MOCVD), molecular beam epitaxy (MBE), atomic layer deposition (ALD), etc. in the first cavity 205. Afterwards, hard mask 204 may be removed. In addition, in-situ doping can be carried out when the SiGe nanowires is formed. For example, n-type or p-type dopants can be incorporated into the SiGe nanowires, preferably. In an embodiment, n-type dopants are incorporated in the SiGe nanowire, thereby forming an n-type SiGe nanowire.

Figure 4:
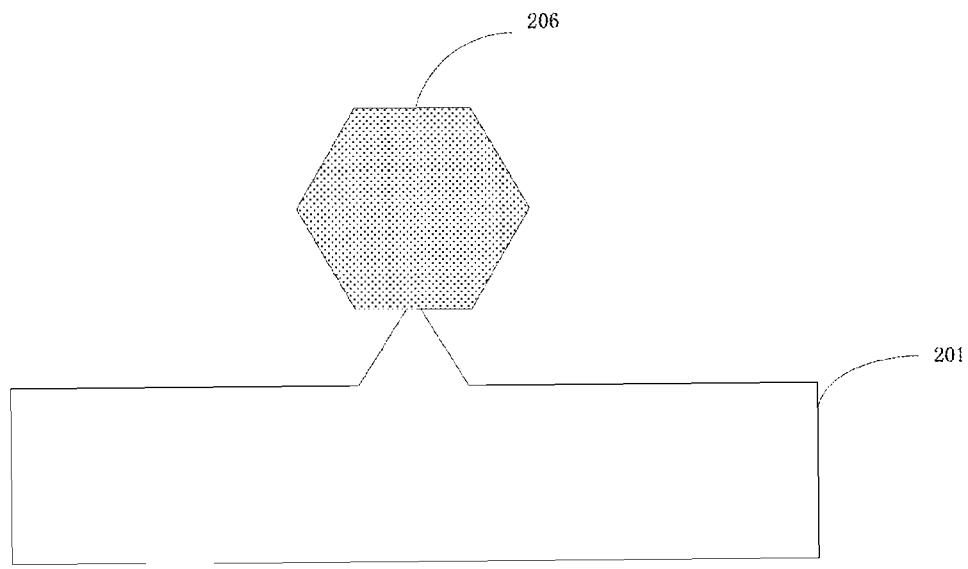
FIG. 4 is a cross-sectional view illustrating a stage of a method for manufacturing a Ge nanowire device according to an embodiment of the present invention.

In FIG. 4, a portion of the substrate is selectively etched away from the surroundings of SiGe nanowire 206 to substantially expose the surface of the SiGe nanowire 206. Note that the "substantially exposed" refers to removing the surface of the substrate material surrounding the SiGe nanowire, except that a lower surface of the portion SiGe nanowire is covered with the substrate material. In certain embodiments, the SiGe nanowire surface may also be fully exposed.

Figure 5:
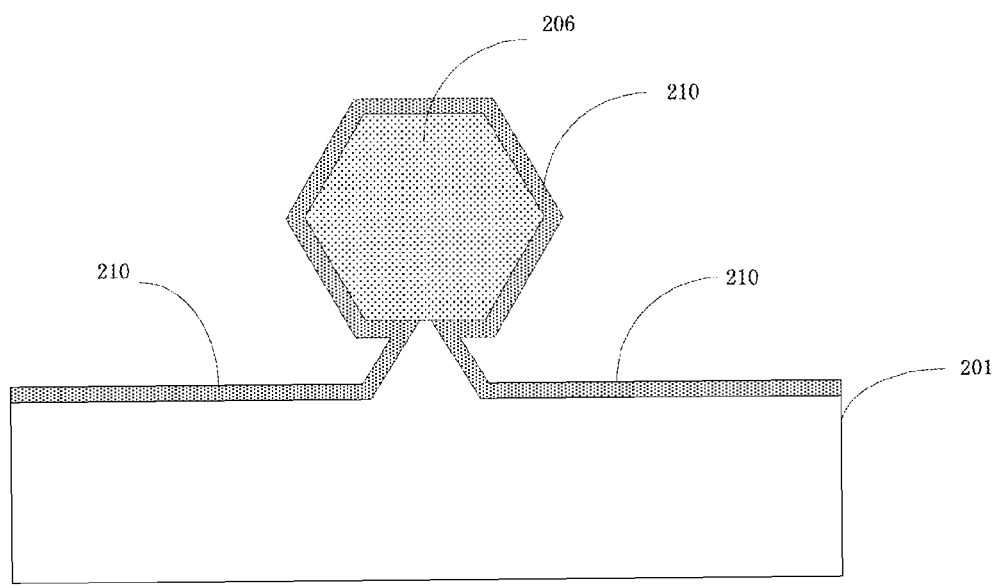
FIG. 5 is a cross-sectional view illustrating a stage of a method for manufacturing a Ge nanowire device according to an embodiment of the present invention.

As shown in FIG. 5, the surface of the SiGe nanowire 206 is oxidized to form an oxide layer 210 on the exposed surface of the SiGe nanowire 206. Oxide layer 210 is also formed on the surface of the substrate 201. During oxidation, the silicon in the SiGe nanowire is gradually consumed, and the germanium in the SiGe nanowire tends to "condense" in the nanowire. Furthermore, when the silicon is consumed Si, the n-type or p-type dopants (if any) in the silicon will gradually spread to the germanium.

Figure 6:
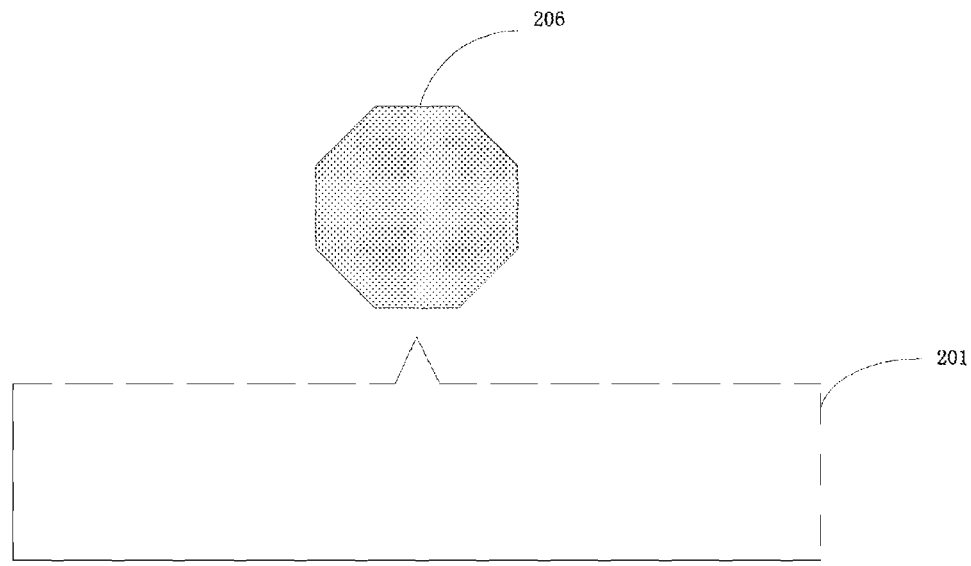
FIG. 6 is a cross-sectional view illustrating a stage of a method for manufacturing a Ge nanowire device according to an embodiment of the present invention.

As shown in FIG. 6, oxide layer 210 is removed. For example, a buffer oxide layer etchant (BOE) or diluted hydrofluoric acid (DHF) can be used to remove the oxide layer 210. In this case, the content of silicon in the SiGe nanowire is reduced, and the shape of the SiGe nanowire 206 becomes close to a circle, for example, from a hexagonal shape to become octagonal.

The process of SiGe nanowire surface oxidation and removal of the oxide layer is repeated, thereby forming a Ge nanowires 311 suspended in the cavity by the isolation regions. With the consumption of the silicon in the SiGe nanowire and the silicon substrate material, the SiGe nanowire becomes Ge nanowires 311, and a tunnel region is formed between Ge nanowires 311 and substrate 201.

Figure 7:
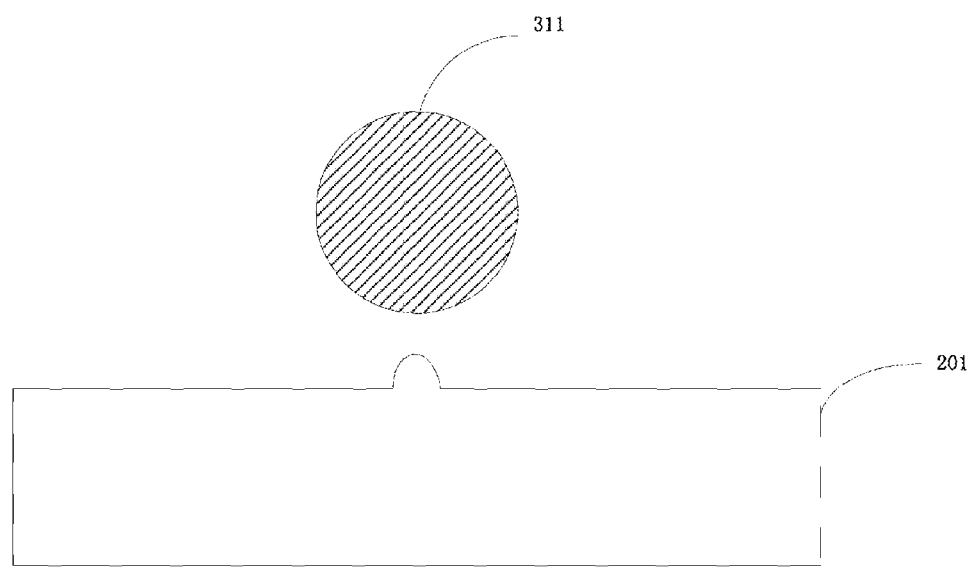
FIG. 7 is a cross-sectional view illustrating a stage of a method for manufacturing a Ge nanowire device according to an embodiment of the present invention.

It will be appreciated that the Ge nanowire formed here may not be composed entirely of Ge. For example, the Ge nanowire may have a Ge content of greater than 90% (atomic percentage). Further, the raised portion located in substrate 201 under Ge nanowire 311 may also be completely removed with the consumption of the substrate material. Further, the number of repetitions of the step of the oxidation and removing the oxide layer can be determined according to the degree rounded shape of the Ge nanowire. Thereafter, the Ge nanowire can be annealed in an atmosphere of an inert gas or reducing gas, e.g., in helium gas He, hydrogen gas $H_2$, or deuterium $D_2$ atmosphere, thereby forming a Ge nanowire having an approximately cylindrical or elliptical cylindrical shape as shown in FIG. 7.

Figure 8:
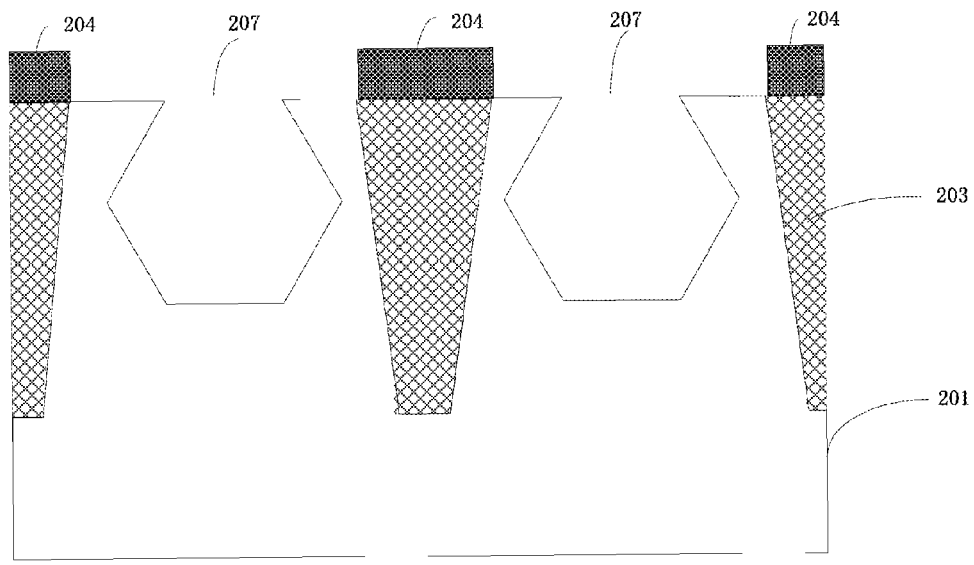
FIG. 8 is a cross-sectional view illustrating a stage of a method for manufacturing an InGaAs nanowire device according to an embodiment of the present invention.

FIGS. 8-12 are cross-sectional view diagrams that illustrate a method for forming an InGaAs nanowire in the substrate structure. As shown in FIG. 8, a substrate 201 is provided. The substrate can be a silicon substrate, but is not so limited. Isolation regions 207 are formed in the substrate. For example, a shallow trench isolation (STI) process can be used to form STI regions 207 in substrate 201. The substrate is etched using a patterned hard mask 204 as an etch mask to form second cavities 207, similar to the formation of the first cavities 205. As shown in the cross-sectional view diagram in FIG. 8, first cavities 208 can have a sigma (Σ) shape. Alternatively, the cavities can have a bowl shape, rectangular shape, conical shape, or triangular shape. The cavities can have other shapes, such as polygonal, e.g., octagonal, etc.

Figure 9:
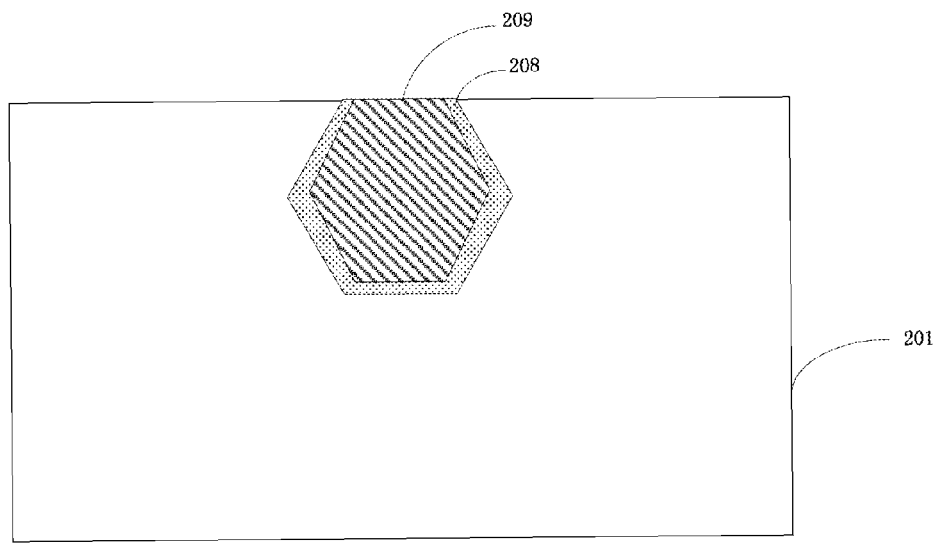
FIG. 9 is a cross-sectional view illustrating a stage of a method for manufacturing an InGaAs nanowire device according to an embodiment of the present invention.
Figure 17:
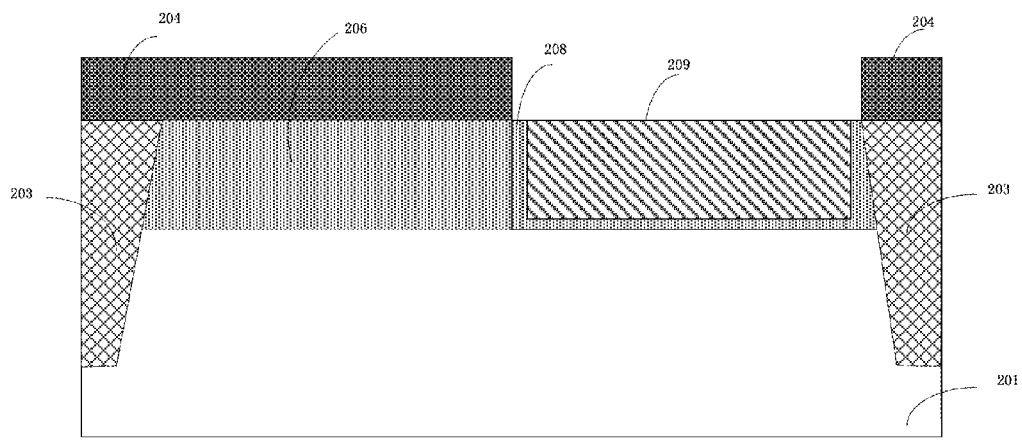
FIG. 17 is a cross-sectional view illustrating a stage of a method for manufacturing a Ge nanowire device and an InGaAs nanowire device according to another embodiment of the present invention.

In FIGS. 9-12, a single cavity is used in the remaining process of forming the Ge nanowire. As shown in FIG. 9, a silicon germanium (SiGe) buffer layer 208 is formed in the surface of the second cavity, and an InGaAs material is used to fill the cavity in substrate 201 to form an InGaAs nanowire 209. It is noted that the cavities do not need to be completely filled. In some embodiments, the top surface of InGaAs here or the SiGe in the Ge nanowire can be lower than the top surface of isolation regions 203, such as shown in FIG. 17. In some embodiments, InGaAs nanowire 209 can be formed by epitaxial growth, chemical vapor deposition (CVD), metal organic chemical vapor deposition (MOCVD), molecular beam epitaxy (MBE), atomic layer deposition (ALD), etc. in the second cavity 207. Afterwards, hard mask 204 may be removed. In addition, in-situ doping can be carried out when the InGaAs nanowires are formed. For example, n-type or p-type dopants can be incorporated into the InGaAs nanowires, preferably. In an embodiment, p-type dopants are incorporated in the InGaAs nanowire, thereby forming a p-type InGaAs nanowire.

Figure 10:
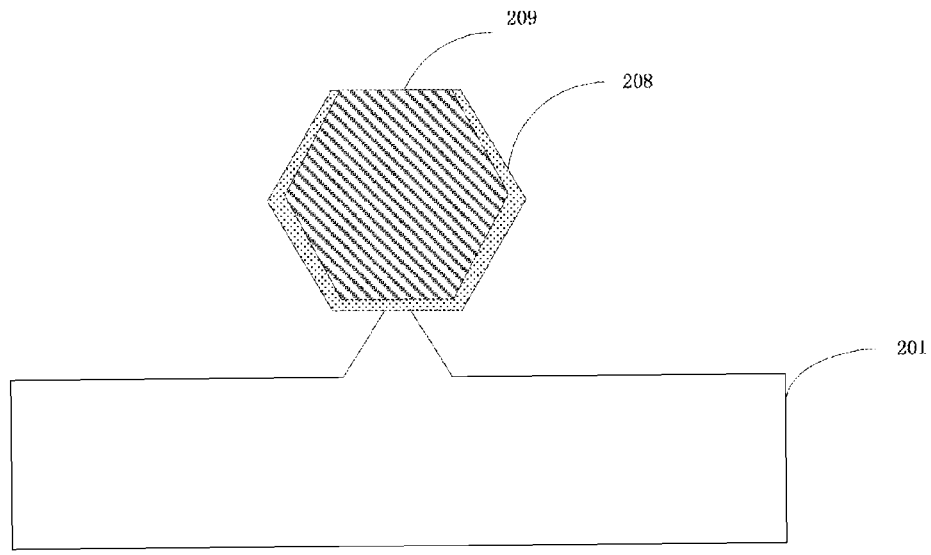
FIG. 10 is a cross-sectional view illustrating a stage of a method for manufacturing an InGaAs nanowire device according to an embodiment of the present invention.

In FIG. 10, a portion of the substrate is selectively etched away from the surroundings of SiGe buffer layer 208 and InGaAs nanowire 209 to substantially expose the surface of the SiGe buffer layer 208. Note that the "substantially exposed" refers to removing the surface of the substrate material surrounding the SiGe buffer layer 208, except that a lower surface of the portion SiGe nanowire is covered with the substrate material. In certain embodiments, the SiGe nanowire surface may also be fully exposed.

Figure 11:
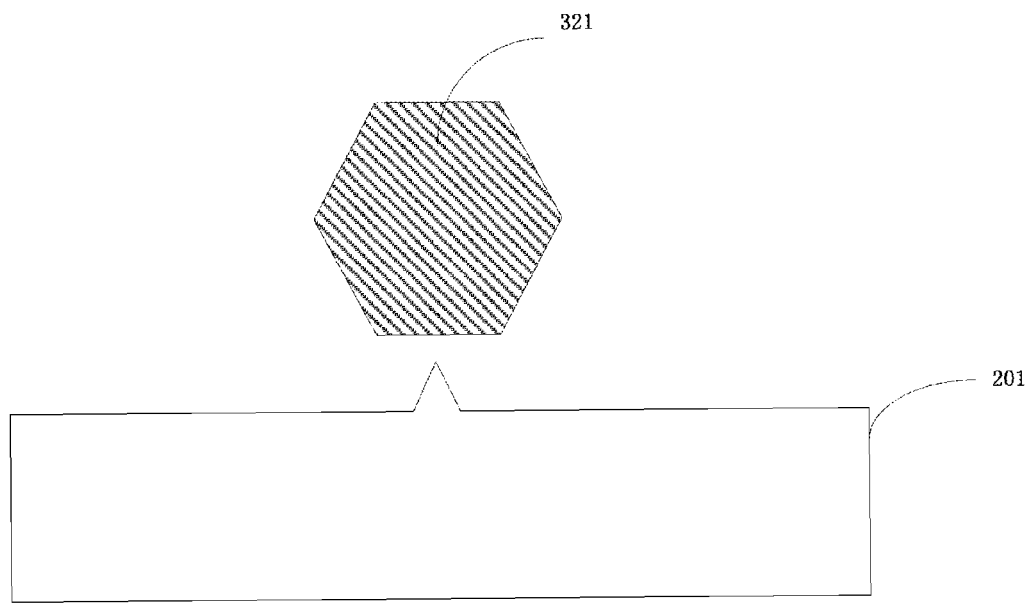
FIG. 11 is a cross-sectional view illustrating a stage of a method for manufacturing an InGaAs nanowire device according to an embodiment of the present invention.

As shown in FIG. 11, the SiGe buffer layer 208 is selectively removed from InGaAs nanowire 209. During the removal or etching process, the connected part between the InGaAs nanowire and the substrate is also removed. For example, the raise portion of the substrate as shown in FIG. 11 may also be removed. InGaAs nanowire 321 is formed, and a tunnel region is formed between InGaAs nanowire 321 and substrate 201.

Figure 12:
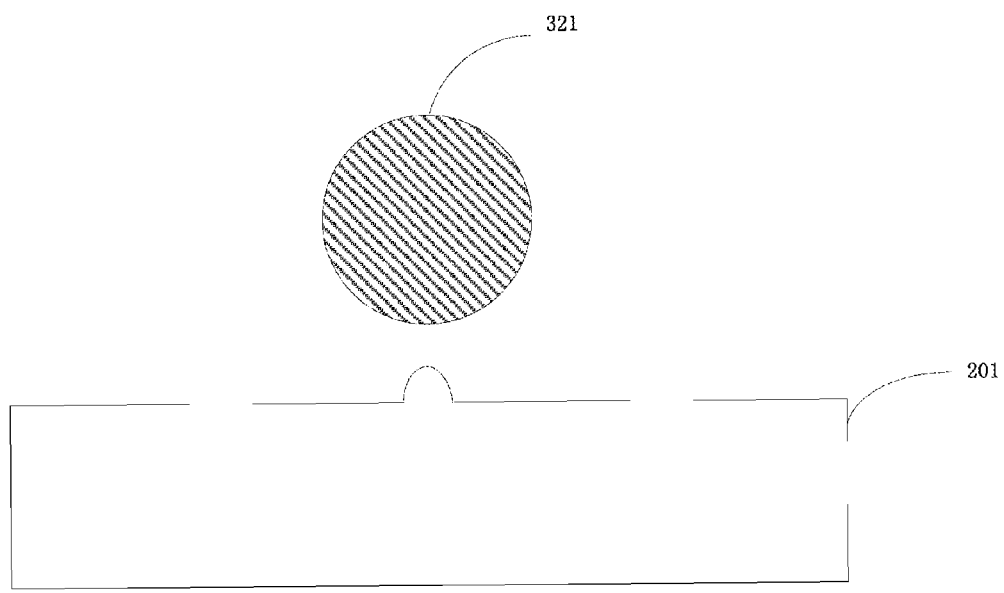
FIG. 12 is a cross-sectional view illustrating a stage of a method for manufacturing an InGaAs nanowire device according to an embodiment of the present invention.

Next, the InGaAs nanowire 321 can be annealed in an atmosphere of an inert gas or reducing gas, e.g., in helium gas He, hydrogen gas $H_2$, or deuterium $D_2$ atmosphere, thereby forming a Ge nanowire having an approximately cylindrical or elliptical cylindrical shape as shown in FIG. 12. It is understood, that the second nanowire can be formed using other group III-V semiconductor materials using a process similar to the one described above with reference to InGaAs nanowires.

In embodiments of the invention, the Ge nanowire and the InGaAs nanowire can be formed as the first nanowire and the second nanowire as described above. In some embodiments, certain steps in the formation of the Ge nanowire and the InGaAs nanowire can be combined.

FIGS. 13-18 illustrate a manufacturing process of Ge and InGaAs nanowires in accordance with another embodiment of the invention. Detailed processes for the formation Ge nanowires and InGaAs nanowires are already described above and, therefore, some of the steps below are described briefly.

Figure 13:
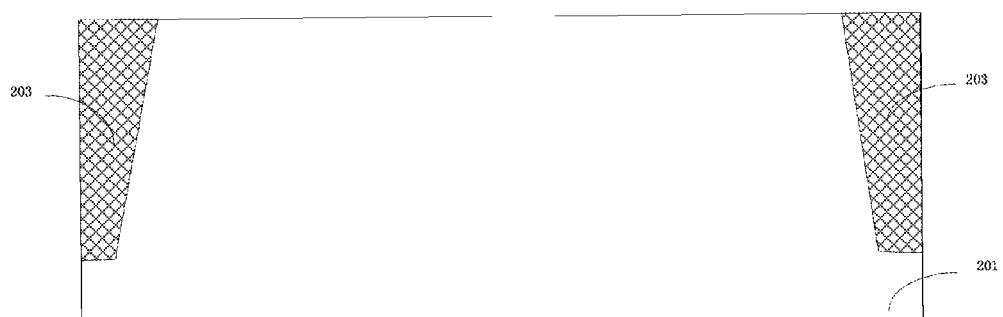
FIG. 13 is a cross-sectional view illustrating a stage of a method for manufacturing a Ge nanowire device and an InGaAs nanowire device according to another embodiment of the present invention.

In FIG. 13, isolation regions 203, such as STI regions, are formed in substrate 201.

Figure 14:
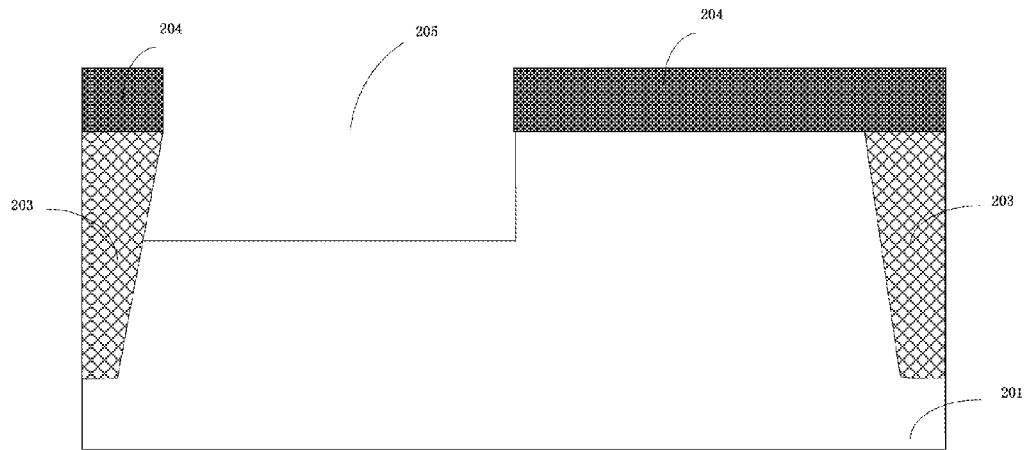
FIG. 14 is a cross-sectional view illustrating a stage of a method for manufacturing a Ge nanowire device and an InGaAs nanowire device according to another embodiment of the present invention.

In FIG. 14, a first cavity 205 is formed in substrate between adjacent isolation regions 203. First cavity 205 will be used to form a Ge nanowire.

Figure 15:
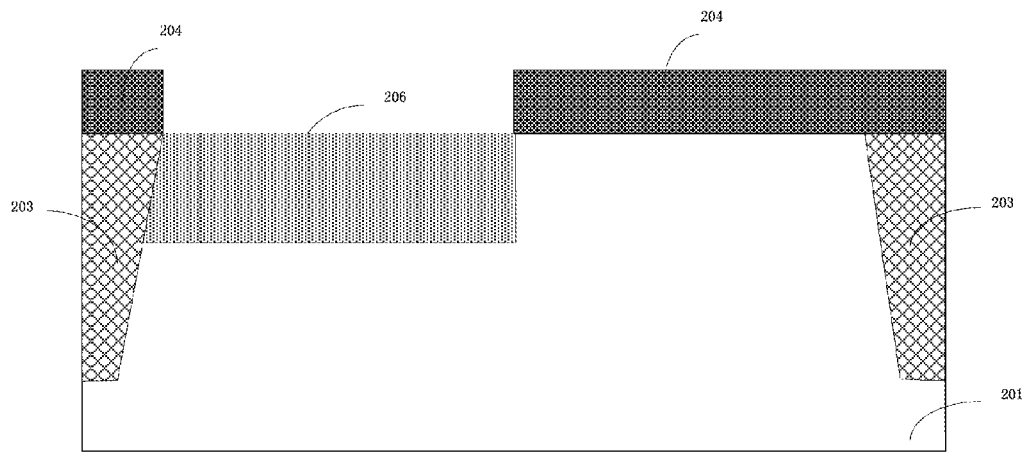
FIG. 15 is a cross-sectional view illustrating a stage of a method for manufacturing a Ge nanowire device and an InGaAs nanowire device according to another embodiment of the present invention.

In FIG. 15, a SiGe nanowire 206 is formed in the first cavity 205.

Figure 16:
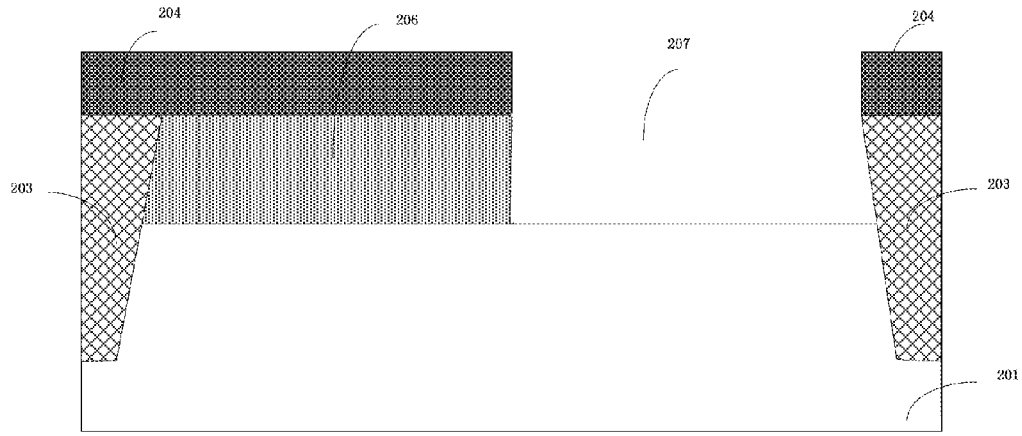
FIG. 16 is a cross-sectional view illustrating a stage of a method for manufacturing a Ge nanowire device and an InGaAs nanowire device according to another embodiment of the present invention.

In FIG. 16, a second cavity 207 is formed in substrate between adjacent isolation regions 203. Second cavity 207 will be used to form an InGaAs nanowire.

In FIG. 17, a SiGe buffer layer is formed on the surface of the second cavity 207, and an InGaAs material is used to fill the second cavity.

Figure 18:
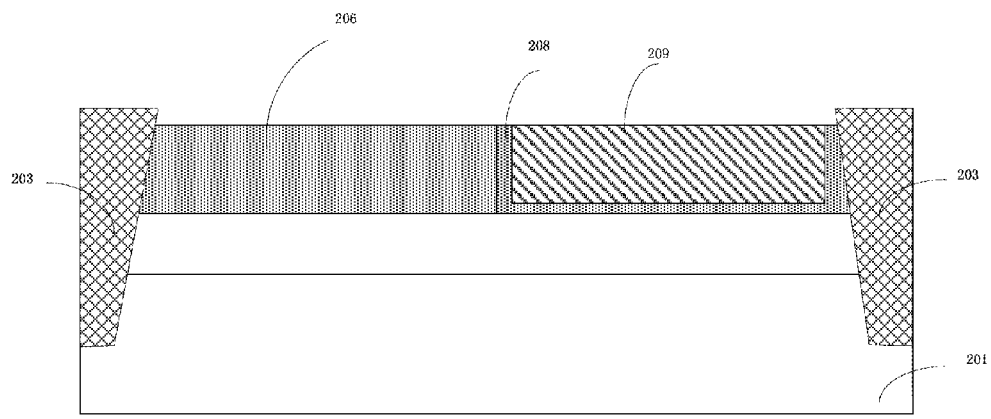
FIG. 18 is a cross-sectional view illustrating a stage of a method for manufacturing a Ge nanowire device and an InGaAs nanowire device according to another embodiment of the present invention.

In FIG. 18, portions of the substrate surrounding the SiGe nanowire and the InGaAs nanowire 209 are removed to substantially expose SiGe nanowire surface 206 (see FIG. 4) and the surface of the SiGe buffer layer 208 (see FIG. 10). Thereafter, Ge nanowires can be formed according to the process shown in FIGS. 5-6, and InGaAs nanowires formed according to the process shown in FIGS. 11-12. It will be appreciated that the above-mentioned Ge nanowires and InGaAs nanowires can undergo the annealing process simultaneously. Moreover, the Ge nanowire and the InGaAs nanowires can be formed in any order.

After forming the Ge nanowires and InGaAs nanowires, an oxidation process can be carried out to oxidize the substrate 201 to form insulating layer 202 on substrate 201 between isolation regions 203. Such a substrate structure is used in the illustrations in FIGS. 19A-19C.

Figure 19A:
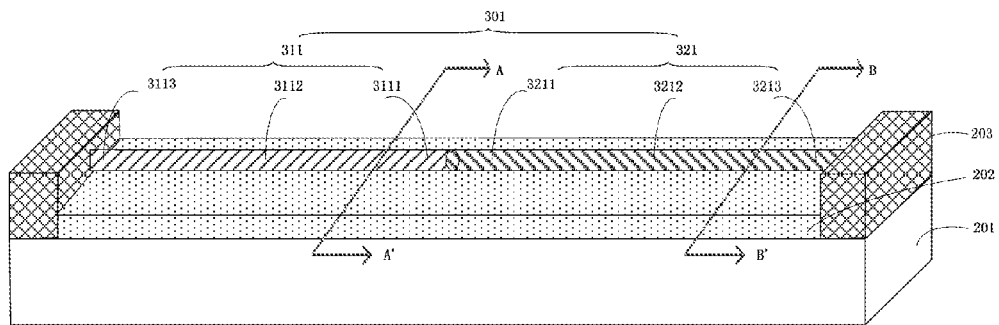
FIG. 19A is a perspective view illustrating a stage of a method for manufacturing a semiconductor device according to an embodiment of the present invention.
Figure 19B:
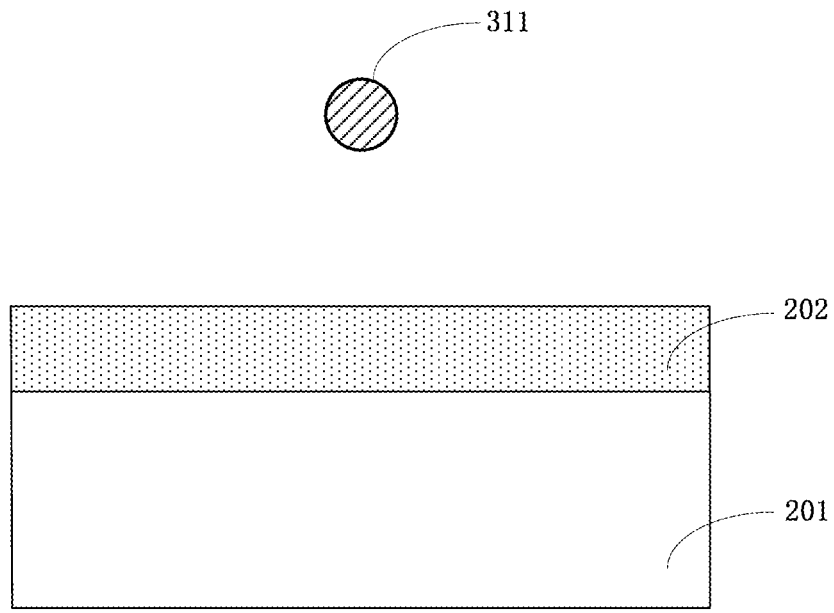
FIG. 19B is a cross-sectional view illustrating the stage of the method for manufacturing a semiconductor device of FIG. 19A along the A-A' direction.
Figure 19C:
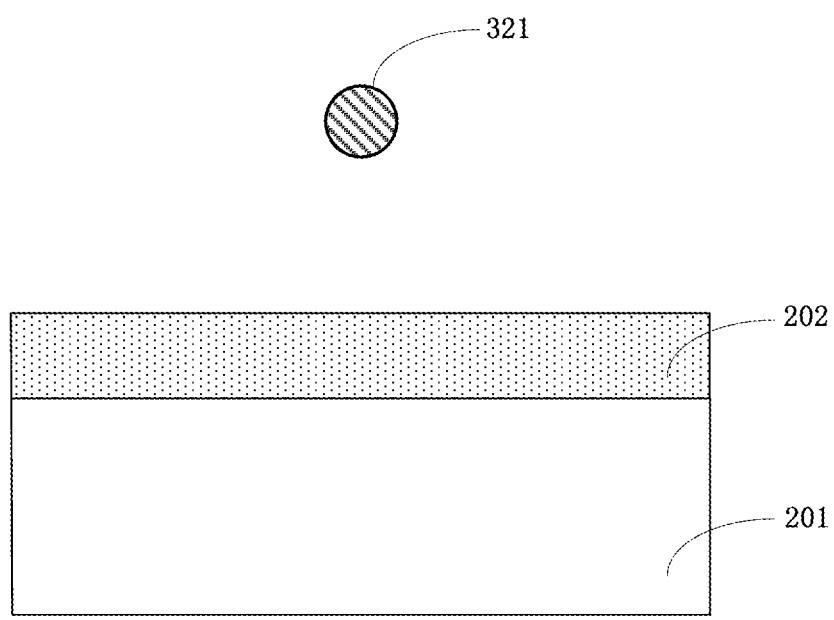
FIG. 19C is a cross-sectional view illustrating the stage of the method for manufacturing a semiconductor device of FIG. 19A along the B-B' direction.
Figure 20A:
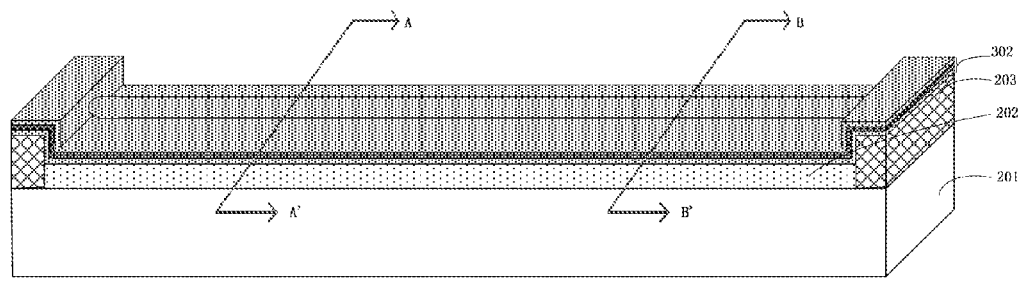
FIG. 20A is a perspective view illustrating a stage of a method for manufacturing a semiconductor device according to an embodiment of the present invention.
Figure 20B:
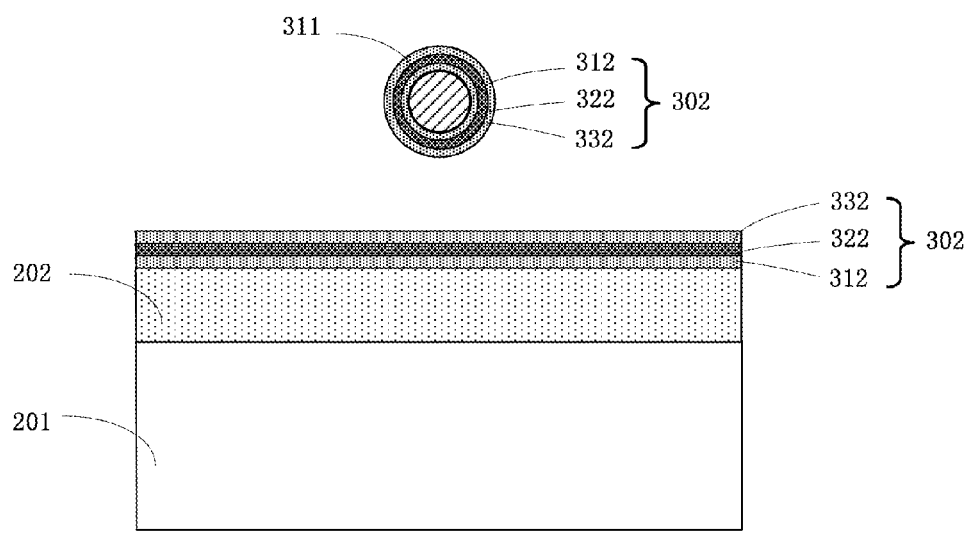
FIG. 20B is a cross-sectional view illustrating the stage of the method for manufacturing a semiconductor device of FIG. 20A along the A-A' direction.
Figure 20C:
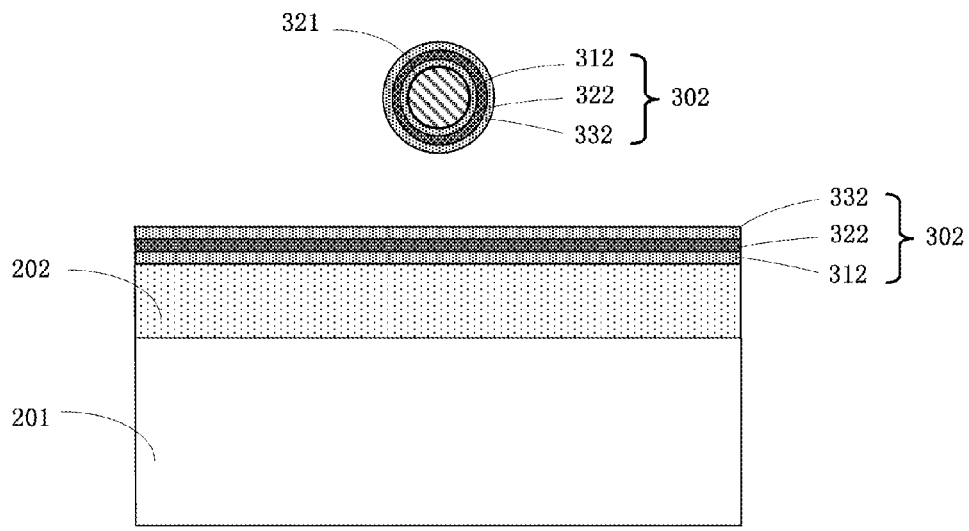
FIG. 20C is a cross-sectional view illustrating the stage of the method for manufacturing a semiconductor device of FIG. 20A along the B-B' direction.
Figure 21A:
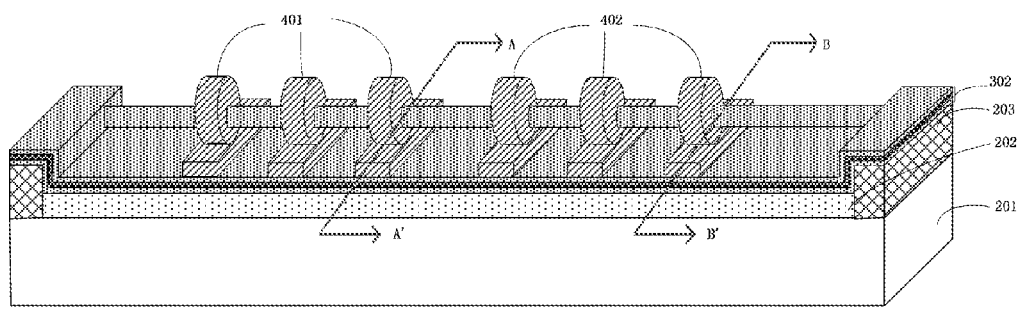
FIG. 21A is a perspective view illustrating a stage of a method for manufacturing a semiconductor device according to an embodiment of the present invention.
Figure 21B:
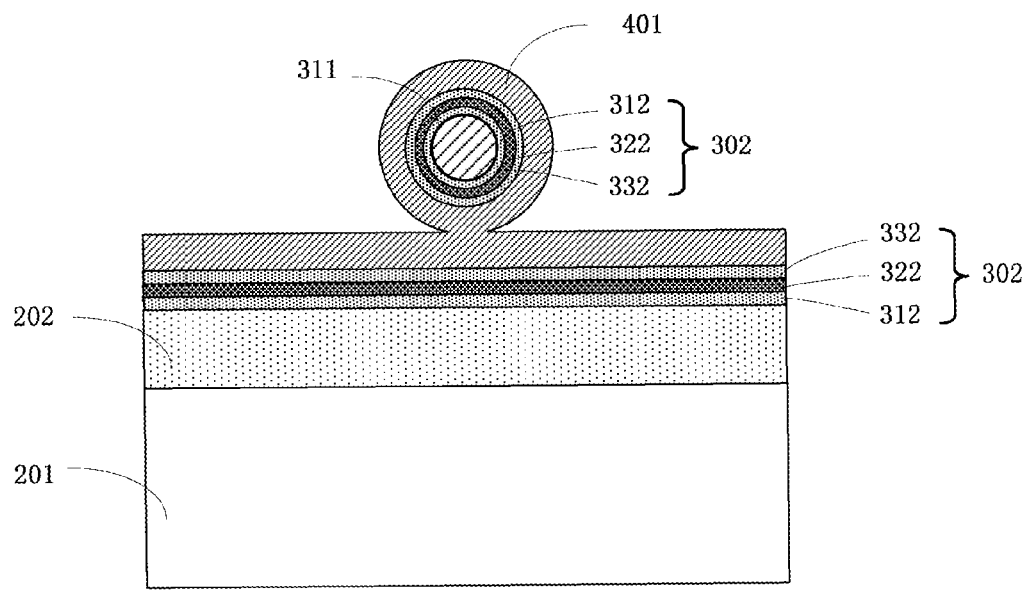
FIG. 21B is a cross-sectional view illustrating the stage of the method for manufacturing a semiconductor device of FIG. 21A along the A-A' direction.

In the description which follows, FIGS. 19A, 20A, FIG. 21A, etc., are perspective views of a stage of a semiconductor device manufacturing method according to an embodiment of the present invention. FIG. 19B, FIG. 20B, FIG. 21B, etc., respectively, are cross-sectional views taken along the A-A' direction. Further, FIG. 19C, FIG. 20C, FIG. 21C, etc., are cross-sectional views taken along B-B' direction.

As shown in FIGS. 19A-19C, a nanowire structure 301 is suspended in a cavity between isolation regions 203 in the substrate structure. Nanowire structure 301 includes a first nanowire 311 having a first conductivity type (e.g., n-type) and a second nanowire 321 having a second conductivity type (e.g., p-type). The first nanowire 311 includes a first end region 3111, intermediate region (or channel region) 3112, and a second end region 3113. The second nanowire 321 includes a first end region 3211, intermediate region 3212 (or channel region), and a second end region 3213. The first end region 3111 of the first nanowire 311 is connected to the first end region 3211 of the second nanowire 321. It is understood that the first end regions (3111 and 3211) and the second end regions (3113 and 3213) are at the opposite ends of the respective nanowires. Furthermore, they are not separated from the intermediate regions (3112 and 3212) by specific boundaries. Thus, the respective first end and second end regions of the first and second nanowires do not necessarily have the same length.

In FIGS. 20A-20C, a multi-layer film structure 302 is formed surrounding nanowire structure 301. Multi-layer film structure 302 includes a first dielectric layer 312, a conductive material layer 322, and a second dielectric layer 332.

In an embodiment, multi-layer film structure 302 can be formed using the following processes. First dielectric layer 312 can be formed using an atomic layer deposition (ALD) process, conductive material layer 322 can be formed using a low pressure chemical vapor deposition (LPCVD) process, and second dielectric layer 332 can be formed using an atomic layer deposition (ALD) process. The dielectric and conductive materials can be any suitable dielectric and conductive materials. For example, the conductive material layer can be a polysilicon material or a metal material, e.g., aluminum, tungsten, etc. The first and second dielectric materials can be a high-K dielectric. In some embodiments, the thickness of the conductive material can range from 1-10 nm, e.g., 2 nm, 5 nm, 8 nm, or 10 nm. The thickness of the first and second dielectric layers can range from 1-3 nm, e.g.,
2 nm. As shown in FIGS. 20A-20C, multi-layer film structure 302 is also formed above insulator layer 202 and isolation regions 203.

Figure 21C:
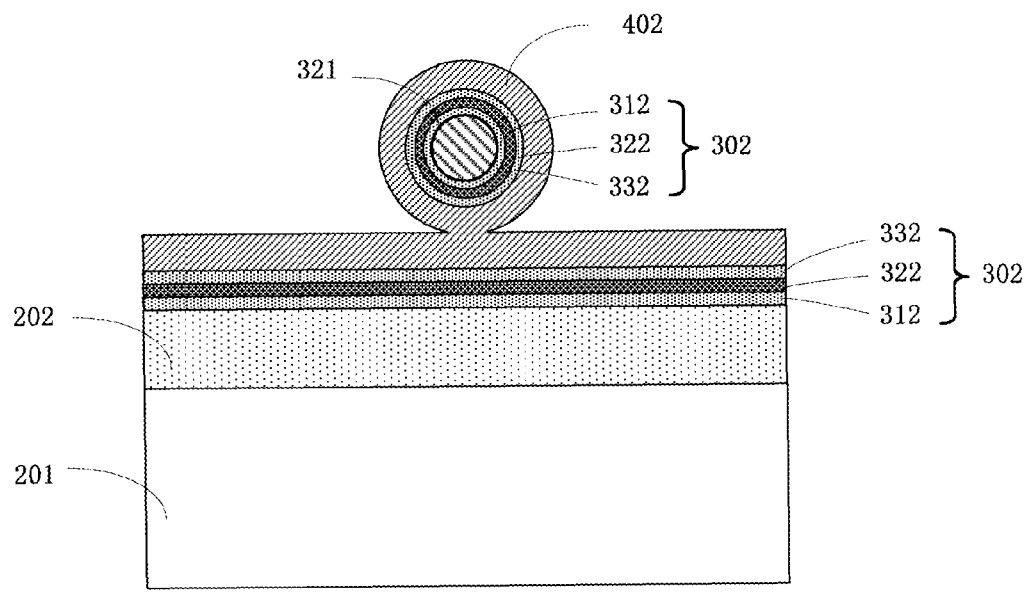
FIG. 21C is a cross-sectional view illustrating the stage of the method for manufacturing a semiconductor device of FIG. 21A along the B-B' direction.

In FIGS. 21A-21C, a plurality of first electrodes 401 is formed surrounding the multi-layer film structure at the channel region of the first nanowire. The plurality of first electrodes are separated from each other by a distance of about 10-50 nm, e.g., 10 nm, 20 nm, 40 nm, or 50 nm. Further, a plurality of second electrodes 402 is formed surrounding the multi-layer film structure at the channel region of the second nanowire. The plurality of second electrodes are separated from each other by a distance of about 10-50 nm, e.g., 10 nm, 20 nm, 40 nm, or 50 nm. The first and second electrodes can be formed by first depositing an electrode material, and then using photolithography and etching to form first and second electrodes. The first and second electrodes can be used as input electrodes in the device.

The method can also introduce dopants of the first conductivity type (e.g., n-type) into the first and second end regions of the second nanowire and regions between the plurality of the second electrodes, and introduce dopants of the second conductivity type (e.g., p-type) into the first and second end regions of the first nanowire and regions between the plurality of the first electrodes. In one embodiment, the first end and second end regions of the first nanowires are heavily doped in the second conductivity type, and the first end region and the second end region in the second nanowire are heavily doped in the first conductivity type. In another embodiment, a lightly doped LDD (lightly doped drain) doping of the second conductivity type dopant, e.g., p-type, can be carried out to the first end region, second end region, and in regions between the plurality of first electrodes 401 in the first nanowire. Similarly, an LDD doping of the first conductivity type dopant, e.g., n-type, can be carried out in the second nanowire. In yet another embodiment, after the LDD doping, the first end and second end regions of the first nanowires are heavily doped in the second conductivity type, and the first end region and the second end region in the second nanowire are heavily doped in the first conductivity type.

Figure 22A:
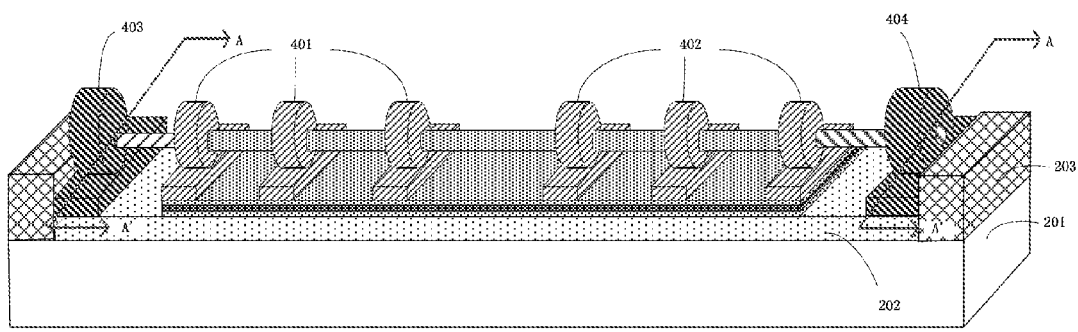
FIG. 22A is a perspective view illustrating a stage of a method for manufacturing a semiconductor device according to an embodiment of the present invention.
Figure 22B:
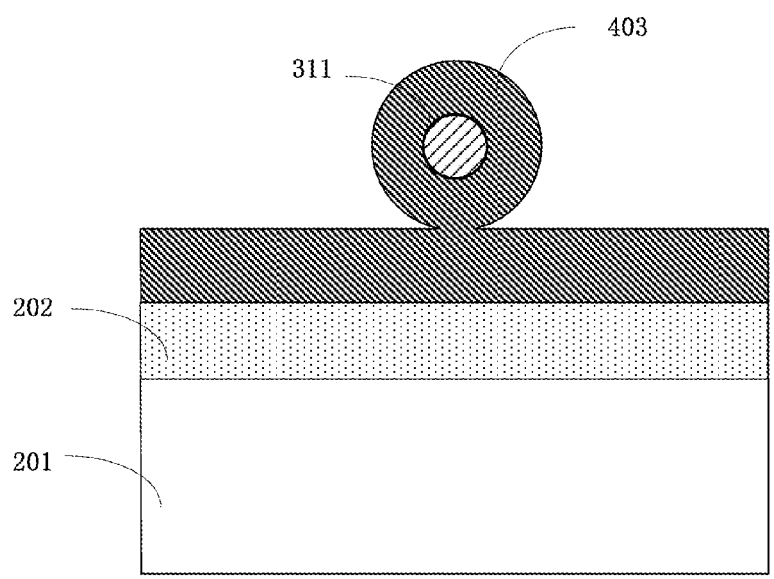
FIG. 22B is a cross-sectional view illustrating the stage of the method for manufacturing a semiconductor device of FIG. 22A along the A-A' direction.
Figure 22C:
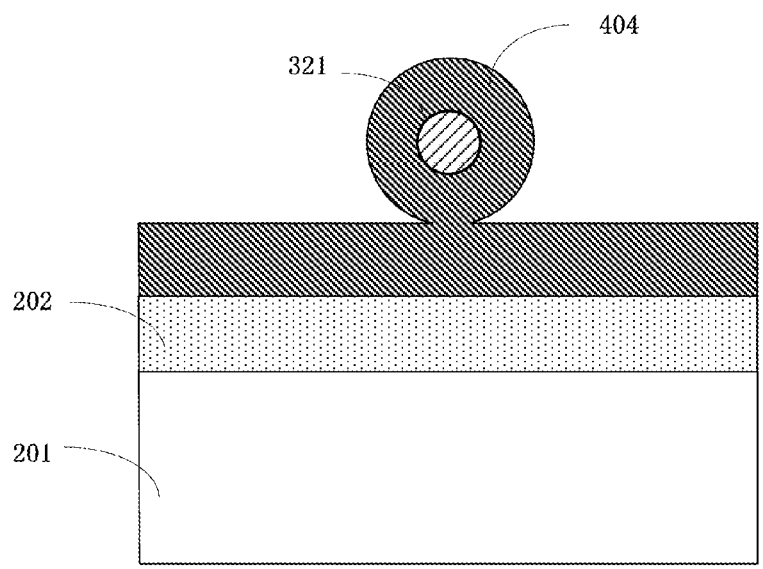
FIG. 22C is a cross-sectional view illustrating the stage of the method for manufacturing a semiconductor device of FIG. 22A along the B-B' direction.

In FIGS. 22A-22C, a third electrode 403 is formed surrounding the second end region of the first nanowire, and a fourth electrode 404 is formed surrounding the second end region of the second nanowire. The third and fourth electrodes can be the source/drain of the n-type vMOS and p-type vMOS. In an embodiment, a selective etch process can be used to remove the multi-layer film structure on the second end region of the first nanowire and on the second end region of the second nanowire, and the two support structures. The second end region of the first nanowire is heavily doped with dopants of the first conductivity type, e. g., n+ type, and an evaporation and lift-off process can be used to form the third electrode 403 surrounding the second end region of the first nanowire. The second end region of the second nanowire is heavily doped with dopants of the second conductivity type, e.g., p+ type, and an evaporation and lift-off process can be used to form the fourth electrode 404 surrounding the second end region of the second nanowire. In some embodiments, the multi-layer film structure can be removed from insulating layer 202.

In some embodiments, the materials for the third and fourth electrodes can be different. For example, the material of the third electrode may include, but is not limited to: Ca (calcium), Sc (scandium), Y (yttrium), and the like. The material for the fourth electrode may include, but is not limited to: Pb (lead), Au (gold), or the like. The third and fourth electrodes contact the heavily doped second end regions of the first and second nanowires of the nanotube.

Figure 23A:
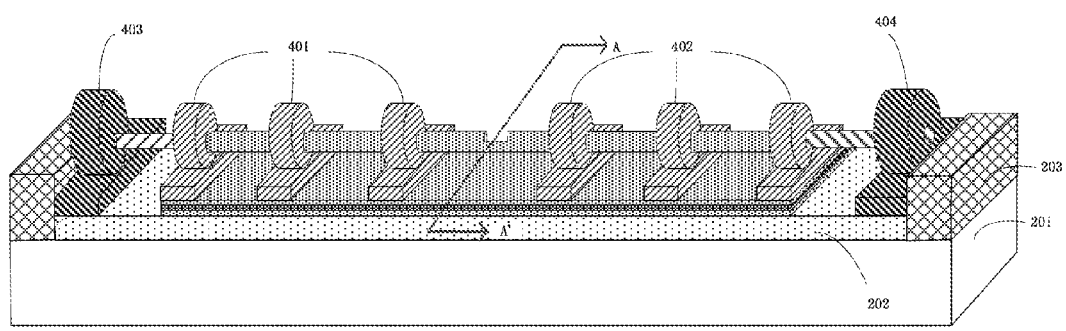
FIG. 23A is a perspective view illustrating a stage of a method for manufacturing a semiconductor device according to an embodiment of the present invention.
Figure 23B:
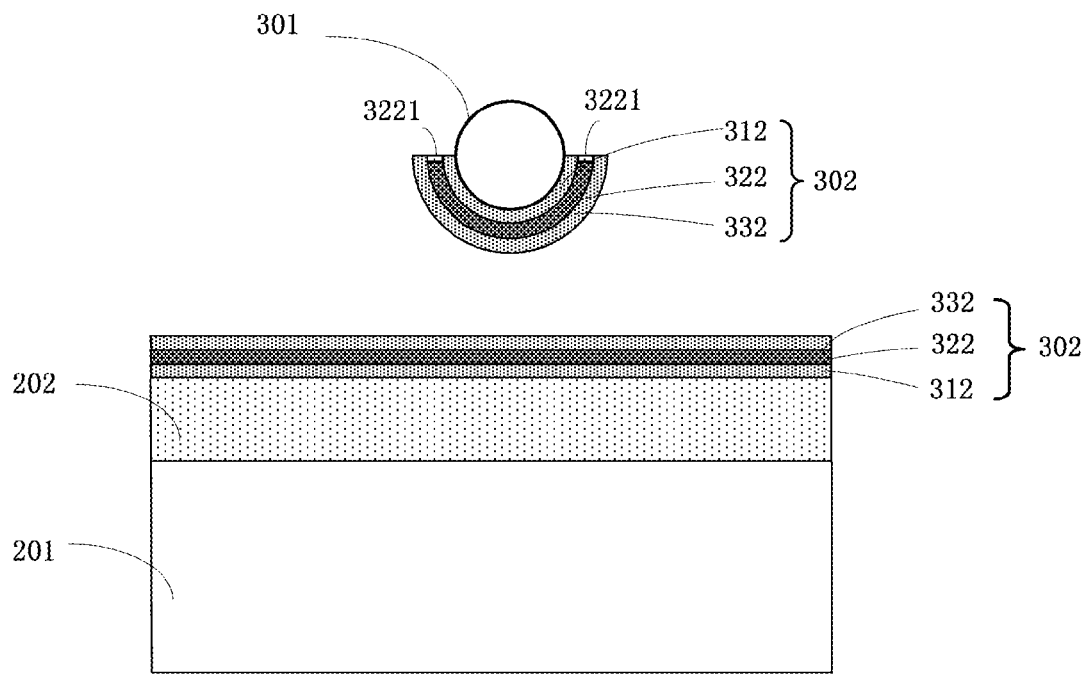
FIG. 23B is a cross-sectional view illustrating the stage of the method for manufacturing a semiconductor device of FIG. 23A along the A-A' direction.
Figure 23C:
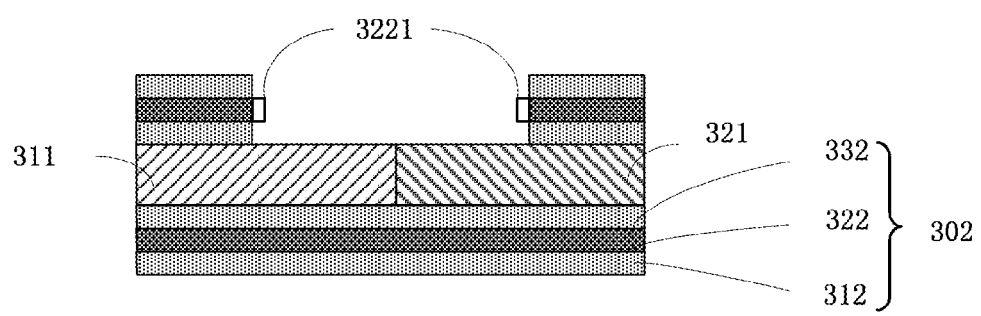
FIG. 23C is a cross-sectional view illustrating the stage of the method for manufacturing a semiconductor device of FIG. 23A along the B-B' direction.

In FIGS. 23A-23C and 24A-24C, the fifth electrode is formed. First, in FIGS. 23A and 23B a nanowire of the multi-layer film structure is removed to expose the first end region of the first nanowire and the first end region of the second nanowire, which are connected. In one example, as shown in FIG. 23B, an upper nanowire of the multi-layer film structure is removed to expose the first end region of the first nanowire and the first end region of the second nanowire. In other embodiments, other parts of the end regions can be removed to allow the fifth electrode to connect the nanowire structure. However, in order to insulate the conductive material layer 322 in the multi-layer film structure, an oxidation process can be carried out to form an oxide layer 3221 on the exposed part of the conductive material layer 322 in the multi-layer film structure as shown in FIG. 23B. FIG. 23C is a cross-sectional view along the direction of the nanowire structure.

Figure 24A:
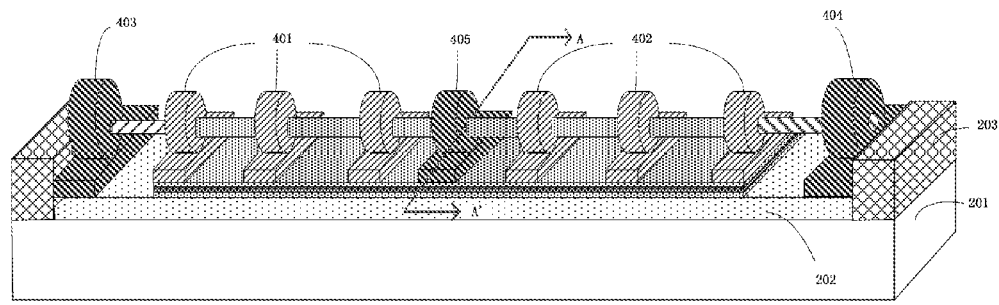
FIG. 24A is a perspective view illustrating a semiconductor device according to an embodiment of the present invention.
Figure 24B:
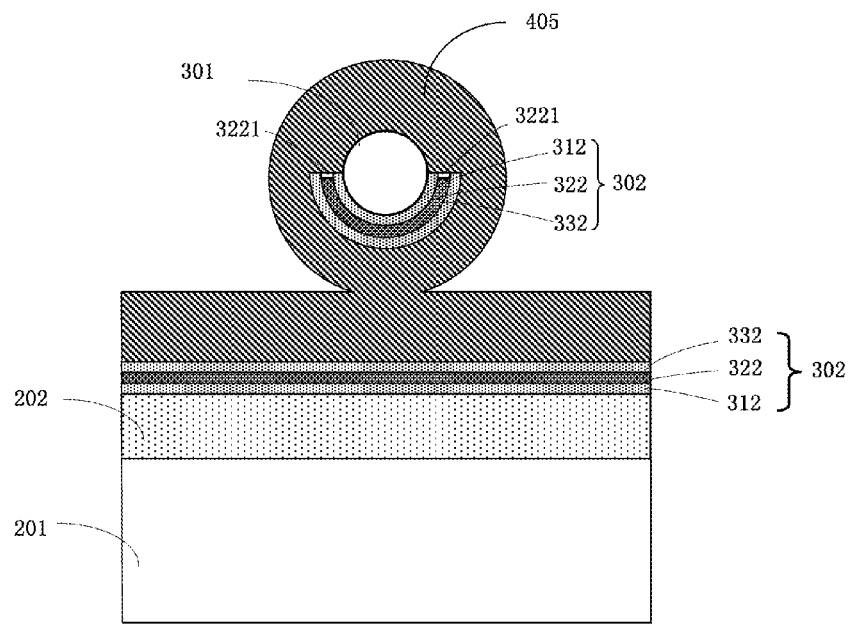
FIG. 24B is a cross-sectional view illustrating the semiconductor device of FIG. 24A.

In FIGS. 24A and 24B, an evaporation and lift-off process can be used to form a fifth electrode 305 surrounding the first end regions of the first nanowire and the second nanowire. The fifth electrode 405 is coupled to the exposed first end region of the first nanowire and the exposed first end region of the second nanowire. The fifth electrode is insulated from the conductive material layer in the multi-layer film structure. The fifth electrode can be a common output electrode for the n-type vMOS and p-type vMOS. The nanowire structure is supported on the substrate by the plurality of first electrodes, the plurality of second electrodes, the third electrode, the fourth electrode, and the fifth electrode support.

Embodiments of the invention provide a method of manufacturing a semiconductor device including the formation of a full-surround channel region of complementary nanowire structure neural components. The method can enhance the floating gate to the control of the channel to avoid short channel effect. The manufacturing process of the device is more optimized, and the resulting device structure is also simpler. Further, the higher carrier mobilities can improve the device performance.

Figure 24C:
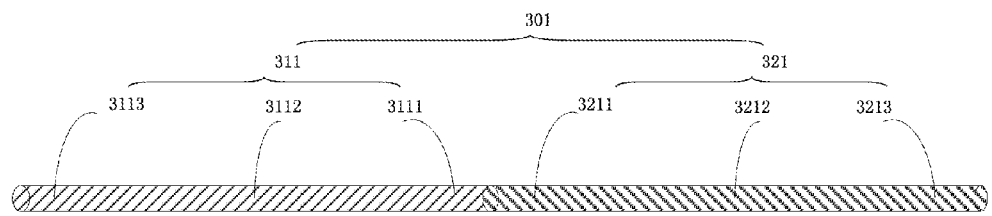
FIG. 24C is a schematic view illustrating the semiconductor device of FIG. 24A.

FIG. 24A is a perspective view illustrating a semiconductor device according to an embodiment of the present invention. FIG. 24B is a cross-sectional view illustrating the semiconductor device of FIG. 24A along the A-A' direction. FIG. 24C is a schematic view illustrating the semiconductor device of FIG. 24A.

As shown in FIGS. 24A and 24B, according to some embodiments of the present invention, a semiconductor device includes a substrate 201 and an insulating layer 202 overlying the substrate. A nanowire structure 301 is located above the insulating layer. The nanowire structure includes a first nanowire 311 and a second nanowire 321. The first and second nanowires, respectively, include a first end region, a channel region, and a second end region. The first end region 3111 of the first nanowire is connected to the first end region 3211 of the second nanowire. The first nanowire and the second nanowire have different conductivity types. The first and second end regions of the first nanowire have the first conductivity type, and the first and second end regions of the second nanowire have the second conductivity type. A multi-layer film structure 302 surrounds the channel region 3112 and the first end region 3111 of the first nanowire 311 and the channel region 3212 and the first end region 3211 of the second nanowire 321. The multi-layer film structure 302 includes a first dielectric layer 312, a conductive material layer 322, and a second dielectric layer 332. The multi-layer film structure is partially removed to expose the first end region of the first nanowire and the first end region of the second nanowire.

A plurality of first electrodes 401 are disposed surrounding the multi-layer film structure at the channel region of the first nanowire. The plurality of first electrodes are separated from each other. A plurality of second electrodes 402 are disposed surrounding the multi-layer film structure at the channel region of the second nanowire. The plurality of second electrodes are separated from each other. The device also has a third electrode 403 surrounding the second region of the first nanowire, and a fourth electrode 404 surrounding the second region of the second nanowire. The device further has a fifth electrode 405 coupled to the exposed first end region of the first nanowire and the exposed first end region of the second nanowire. The fifth electrode is insulated from the conductive material layer in the multi-layer film structure. The nanowire structure is supported on the substrate by the plurality of first electrodes, the plurality of second electrodes, the third electrode, the fourth electrode, and the fifth electrode.

In an embodiment, the first nanowire 311 includes a Ge nanowire, and the second nanowire 321 includes nanowires of a III-V group material. Further, the III-V group material may include one or more of the following: InGaAs, InAlAs, InAs, and InSb. In this embodiment, the first nanowire 311 of the nanowire structure is a p-type device, with the first and second end regions having a conductive type of p-type and the channel regions having a conductivity of n-type. Similarly, the second nanowire 321 of the nanowire structure is an n-type device, with the first and second end regions having a conductive type of n-type and the channel regions having a conductivity of p-type. The semiconductor device can be used as a complementary neuron nanowire structure device. The device has an n-type vMOS and a p-type vMOS. The p-type vMOS has a plurality of input electrodes (the third electrodes), n-type vMOS has a plurality of input electrodes (the fourth electrodes), and both share a common floating gate (conductive material layer) and an output electrode (the five electrode). It works as follows: the third electrode 403 is grounded, the fourth electrode 404 is coupled to a positive power supply, each of the first electrodes 401 and the second electrodes 402 is an input signal input electrode, and the fifth electrode is an output electrode for providing an output signal. When a plurality of the first electrodes 401 and the second electrodes 402 receive input signals, the signals are weighted to obtain the potential $\Phi_F$ of the conductive material layer 322 as a floating gate. Potential $\Phi_F$ is applied to channel regions 3112 and 3212 in the first and second nanowires of the nanowire structure. When $\Phi_F$ is positive and reaches a certain preset value, such that the potential barrier between the channel region 2172 and the first end region 2171 of the second nanowire 321 is reduced, electrons can flow from the second end of the first nanowire through the channel region into the first end region; namely, the n-type vMOS is in conduction, and the output at the fifth electrode is 1. When $\Phi_F$ is negative and reaches a certain preset value, such that the potential barrier between the channel region and the first end region of the first nanowire 311 is reduced, holes can flow from the second end of the second nanowire through the channel region into the first end region; namely, the p-type vMOS is in conduction, and the output at the fifth electrode is 0. The carrier mobilities are enhanced because the p-type vMOS includes Ge in the channel region and the n-type vMOS includes a III-V group material in the channel region.

In an embodiment of the device, the second end region of the first nanowire is more heavily doped than the first end region and the channel region of the first nanowire. Further, the second end region of the second nanowire is more heavily doped than the first end region and the channel region of the second nanowire.

In an embodiment, a nanowire of the multi-layer film structure is disposed between the electrodes and the insulating layer overlying the substrate.

In an embodiment, the first dielectric layer and the second dielectric layer in the multi-layer film structure include a high K dielectric. The conductive material layer in the multi-layer film structure includes a polysilicon material or a metal material. In an embodiment, the conductive material layer in the multi-layer film structure comprises a polysilicon material or a metal material.

In an embodiment, the conductive material layer thickness can be in the range of 2-10 nm, for example, 2 nm, 5 nm, 8 nm, or 10 nm. The first dielectric layer thickness can be in the range of 1-3 nm, for example, 1 nm, 2 nm, or 3 nm. The thickness range of the second dielectric layer can be in the range of 1-3 nm, for example, 1 nm, 2 nm, or 3 nm. The length of the nanowire structure can be 60-1000 nm. The length of the first nanowire can be 30-500 nm, and the length of the second can be 30-500 nm. Adjacent first electrodes are spaced from each other by a distance of 10-50 nm, e. g., 10 nm, 20 nm, 30 nm, 40 nm, or 50 nm. An adjacent plurality of second electrodes are spaced from each other a distance of 10-50 nm, e. g., 10 nm, 20 nm, 30 nm, 40 nm, or 50 nm.

Thus, a manufacturing method of the semiconductor device has been described in detail and according to an embodiment of the present disclosure. In order to maintain clarity of the disclosed concept, certain details known in the art are not described in detail. Those skilled in the art can understand how to implement technical solutions disclosed herein based on the above description.

Unless otherwise indicated, terms such as "first" and "second" are used to distinguish the elements described. Thus, these terms are not necessarily intended to represent the time of these elements or other order. In addition, terms such as "front," "after," "top," "bottom," "upper," and "lower" are used to describe the position in the illustrations and are not intended for describing permanent relative positions permanently.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method for forming a semiconductor device, comprising:
   providing a substrate structure, the substrate structure including:
   a substrate;
   a plurality of isolation regions in the substrate;
   a cavity between adjacent isolation regions; and
   a nanowire structure having a first nanowire and a second nanowire suspended in the cavity, the first and second nanowires, respectively, including a first end region, a channel region, and a second end region; wherein the first end region of the first nanowire is connected to the first end region of said second nanowire, the first nanowire having a first conductivity type and the second nanowire having a second conductivity type different from the first conductivity type;
   forming a multi-layer film structure surrounding the nanowire structure, the multi-layer film structure including a first dielectric layer, a conductive material layer, and a second dielectric layer;
   forming a plurality of first electrodes surrounding the multi-layer film structure at the channel region of the first nanowire, the plurality of first electrodes being separated from each other;
   forming a plurality of second electrodes surrounding the multi-layer film structure at the channel region of the second nanowire, the plurality of second electrodes being separated from each other;
   introducing dopants of the first conductivity type into the first and second end regions of the second nanowire, and introducing dopants of the second conductivity type into the first and second end regions of the second nanowire; and
   forming a third electrode surrounding the second end region of the first nanowire;
   forming a fourth electrode surrounding the second end region of the second nanowire;
   removing a nanowire of the multi-layer film structure to expose the first end region of the first nanowire and the first end region of the second nanowire; and
   forming a fifth electrode coupled to the exposed first end region of the first nanowire and the exposed first end region of the second nanowire, the fifth electrode being insulated from the conductive material layer in the multi-layer film structure;
   wherein, the nanowire structure is supported on the substrate by the plurality of first electrodes, the plurality of second electrodes, the third electrode, the fourth electrode, and the fifth electrode support.

2. The method of claim 1, wherein forming the third and the fourth electrodes comprises:
   removing by selective etching multi-layer film structures at the second end regions of the first nanowire and the second nanowire;
   using an evaporation and lift-off process to form the third electrode surrounding the second region of the first nanowire, and heavily doping the second end region of the first nanowire with impurities of the first conductivity type; and
   using an evaporation and lift-off process to form the fourth electrode surrounding the second region of the second nanowire, and heavily dope the second end region of the second nanowire with impurities of the second conductivity type.

3. The method of claim 1, wherein forming the fifth electrode comprises:
   using an etch back process to partially remove the multi-layer film structure at the intersection of the first end regions of the first and second nanowires to expose the first end region of the first nanowire and the first end region of the second nanowire;
   oxidizing a surface region of the conductive material layer to form an oxide layer; and
   using an evaporation and lift-off process to form the fifth electrode, the fifth electrode being insulated from the multi-layer film structure by the oxide layer.

4. The method of claim 1, wherein forming a multi-layer film structure surrounding the nanowire structure comprises forming a multi-layer film structure overlying the insulating layer overlying the substrate and the isolation regions.

5. The method of claim 1, wherein the first nanowire is a germanium (Ge) nanowire, and the second nanowire is a nanowire of a III-V group material.

6. The method of claim 1, wherein providing the substrate structure comprises forming a germanium (Ge) nanowire, which includes:
  providing a substrate including a plurality of trench isolation regions disposed therein;
  forming a first cavity between adjacent trench isolation regions;
  forming a silicon germanium (SiGe) nanowire in the first cavity by filling the first cavity with a SiGe material;
  removing a portion of the substrate surrounding the SiGe nanowire to expose a surface of the SiGe nanowire;
  using an oxidation process to form a layer of oxide on the exposed surface of the SiGe nanowire;
  removing the layer of oxide on the exposed surface of the SiGe nanowire; and
  repeating the above oxidizing and removing processes to form a Ge nanowire.

7. The method of claim 6, wherein providing the substrate structure comprises forming a nanowire of a III-V group material, which includes:
  forming a second cavity between adjacent trench isolation regions;
  forming a SiGe buffer layer over a surface of the second cavity;
  forming a III_V group material over the SiGe buffer layer to fill the second cavity;
  removing a portion of the substrate surrounding the SiGe buffer and the III_V group material to expose a surface of the SiGe buffer layer; and
  removing the SiGe buffer layer to form the nanowire of the III-V group material.

8. The method of claim 7, further comprising annealing the Ge nanowire and the nanowire of the III-V group material in an inert or reducing environment.

9. The method of claim 8, wherein the III-V group material comprises one or more of indium gallium arsenide (InGaAs), indium aluminum arsenide (InAlAs), indium arsenide (InAs), and indium antimonide (InSb).

10. The method of claim 1, further comprising introducing dopants of the first conductivity type into the first and second end regions of the second nanowire and regions between the plurality of the second electrodes, and introducing dopants of the second conductivity type into the first and second end regions of the first nanowire and regions between the plurality of the first electrodes.

11. The method of claim 1, further comprising introducing dopants into the nanowire structure to form lightly doped drain (LDD) regions and heavily doped drain regions.

12. The method of claim 1, wherein the first dielectric layer and the second dielectric layer in the multi-layer film structure comprise a high K dielectric.

13. The method of claim 1, wherein the conductive material layer in the multi-layer film structure comprises a polysilicon material or a metal material.

14. The method of claim 1, wherein:
  the conductive material layer thickness is in the range of 2-10 nm;
  the first dielectric layer thickness is in the range of 1-3 nm;
  the thickness range of the second dielectric layer is in the range of 1-3 nm;
  the length of the first nanowire is 30-500 nm;
  the length of the second nanowire is 30-500 nm;
  adjacent first electrodes are spaced from each other by a distance of 10-50 nm; and
  an adjacent plurality of second electrodes are spaced from each other a distance of 10-50 nm.

15. A semiconductor device, comprising:
  a substrate and an insulating layer overlying the substrate;
  a nanowire structure having a first nanowire and a second nanowire overlying the insulating layer, said first and second nanowires, respectively, comprising a first end region, a channel region, and a second end region; wherein said first end region of the first nanowire is connected to the first end region of said second nanowire, said first nanowire and said second nanowire having different conductivity types;
  a multi-layer film structure surrounding the channel region and the first end region of the first nanowire and the channel region and the first end region of the second nanowire, the multi-layer film structure including a first dielectric layer, a conductive material layer, and a second dielectric layer; wherein the multi-layer film structure is partially removed to expose the first end region of the first nanowire and the first end region of the second nanowire;
  a plurality of first electrodes surrounding the multi-layer film structure at the channel region of the first nanowire, the plurality of first electrodes being separated from each other;
  a plurality of second electrodes surrounding the multi-layer film structure at the channel region of the second nanowire, the plurality of second electrodes being separated from each other;
  a third electrode surrounding the second region of the first nanowire;
  a fourth electrode surrounding the second region of the second nanowire; and
  a fifth electrode coupled to the exposed first end region of the first nanowire and the exposed first end region of the second nanowire, the fifth electrode being insulated from the conductive material layer in the multi-layer film structure;
  wherein, the first and second nanowires are supported on the substrate by the plurality of first electrodes, the plurality of second electrodes, the third electrode, the fourth electrode, and the fifth electrode.

16. The device of claim 15, wherein:
  the first nanowire comprises a germanium (Ge) nanowire; and
  the second nanowire comprises a III-V group material.

17. The device of claim 16, wherein the III-V group material comprises one or more of indium gallium arsenide (InGaAs), indium aluminum arsenide (InAlAs), indium arsenide (InAs), indium antimonide (InSb).

18. The device of claim 15, wherein a portion of the multi-layer film structure is disposed between the electrodes and the insulating layer overlying the substrate.

19. The device of claim 15, wherein each of the first dielectric layer and the second dielectric layer in the multi-layer film structure comprises a high K dielectric.

20. The device of claim 15, wherein:
  the conductive material layer thickness is in the range of 2-10 nm;
  the first dielectric layer thickness is in the range of 1-3 nm;
  the thickness range of the second dielectric layer is in the range of 1-3 nm;
  the length of the first nanowire is 30-500 nm;
  the length of the second nanowire is 30-500 nm;

adjacent first electrodes are spaced from each other by a distance of 10-50 nm; and an adjacent plurality of second electrodes are spaced from each other a distance of 10-50 nm.

* * * * *